US012808662B2

(12) United States Patent
Vishwanath et al.

(10) Patent No.: US 12,808,662 B2
(45) Date of Patent: Nov. 24, 2026

(54) DETECTOR FOR PROCESS KIT RING WEAR

(71) Applicant: Applied Materials, Inc., Santa Clara, CA (US)

(72) Inventors: Yogananda Sarode Vishwanath, Bangalore (IN); Phillip A. Criminale, Livermore, CA (US)

(73) Assignee: Applied Materials, Inc., Santa Clara, CA (US)

( * ) Notice: Subject to any disclaimer, the term of this patent is extended or adjusted under 35 U.S.C. 154(b) by 409 days.

(21) Appl. No.: 18/401,881

(22) Filed: Jan. 2, 2024

(65) Prior Publication Data

US 2024/0183656 A1 Jun. 6, 2024

Related U.S. Application Data

(62) Division of application No. 16/946,147, filed on Jun. 8, 2020, now Pat. No. 11,913,777.

(Continued)

(51) Int. Cl.
*G01B 11/30* (2006.01)
*H01J 37/32* (2006.01)
(Continued)

(52) U.S. Cl.
CPC ...... *G01B 11/303* (2013.01); *H01J 37/32495* (2013.01); *H01J 37/32642* (2013.01);
(Continued)

(58) Field of Classification Search
CPC .. G01B 11/303; H10P 72/722; H10P 72/7612; H10P 72/0454; H10P 72/0604;
(Continued)

(56) References Cited

U.S. PATENT DOCUMENTS 7,110,110 B2 9/2006 Fink
10,014,198 B2 7/2018 Richardson
(Continued)

FOREIGN PATENT DOCUMENTS

CN 1849691 A 10/2006
CN 103119705 A 5/2013
(Continued)

OTHER PUBLICATIONS

International Preliminary Report on Patentability for International Application No. PCT/US2020/037208, mailed Dec. 23, 2021, 10 Pages.

(Continued)

*Primary Examiner* — Monica D Harrison
(74) *Attorney, Agent, or Firm* — Lowenstein Sandler LLP

(57) ABSTRACT

A diagnostic disc includes a disc body having a sidewall around a circumference of the disc body and at least one protrusion extending outwardly from a top of the sidewall. A non-contact sensor is attached to an underside of each of the at least one protrusion. A printed circuit board (PCB) is positioned within an interior formed by the disc body. Circuitry is disposed on the PCB and coupled to each non-contact sensor, the circuitry including at least a wireless communication circuit, a memory, and a battery. A cover is positioned over the circuitry inside of the sidewall, where the cover seals the circuitry within the interior formed by the disc body from an environment outside of the disc body.

20 Claims, 18 Drawing Sheets

Related U.S. Application Data

(60) Provisional application No. 62/859,879, filed on Jun. 11, 2019.

(51) Int. Cl.
*H10P 72/72* (2026.01)
*H10P 72/76* (2026.01)

(52) U.S. Cl.
CPC .. *H01J 37/32715* (2013.01); *H01J 37/32807* (2013.01); *H10P 72/722* (2026.01); *H10P 72/7612* (2026.01); *H01J 2237/24495* (2013.01); *H01J 2237/24592* (2013.01)

(58) Field of Classification Search
CPC ........... H01J 37/32495; H01J 37/32642; H01J 37/32715; H01J 37/32807; H01J 2237/24495; H01J 2237/24592; H01J 37/244
USPC ........................................................... 438/14
See application file for complete search history.

(56) References Cited

U.S. PATENT DOCUMENTS

| | | | |
|---|---|---|---|
| 10,062,599 | B2 | 8/2018 | Genetti et al. |
| 2006/0081459 | A1 | 4/2006 | Tsai et al. |
| 2015/0153729 | A1 | 6/2015 | Kurahashi et al. |
| 2016/0141154 | A1 | 5/2016 | Kamata et al. |
| 2016/0211166 | A1 | 7/2016 | Yan et al. |
| 2016/0216185 | A1 | 7/2016 | Gottscho |
| 2016/0363556 | A1 | 12/2016 | Sugita et al. |
| 2017/0053819 | A1 | 2/2017 | Richardson |
| 2017/0213758 | A1 | 7/2017 | Rice et al. |
| 2017/0263478 | A1 | 9/2017 | McChesney et al. |
| 2017/0287682 | A1 | 10/2017 | Musselman et al. |
| 2018/0040460 | A1 | 2/2018 | Gottscho |
| 2018/0047599 | A1 | 2/2018 | Chiang et al. |
| 2018/0061696 | A1* | 3/2018 | D'Ambra ............... G01N 21/64 |
| 2018/0350644 | A1 | 12/2018 | Matsuura |
| 2020/0013657 | A1 | 1/2020 | Lee et al. |
| 2021/0327688 | A1 | 10/2021 | Sasaki et al. |
| 2021/0366697 | A1 | 11/2021 | Saito et al. |

FOREIGN PATENT DOCUMENTS

| | | | |
|---|---|---|---|
| CN | 105810609 | A | 7/2016 |
| CN | 107689318 | A | 2/2018 |
| JP | 2005513459 | A | 5/2005 |
| JP | 2006196716 | A | 7/2006 |
| JP | 2007263947 | A | 10/2007 |
| JP | 2008544493 | A | 12/2008 |
| JP | 2014003237 | A | 1/2014 |
| JP | 2017005133 | A | 1/2017 |
| JP | 2017163088 | A | 9/2017 |
| KR | 101899784 | B1 | 9/2018 |
| TW | 201633360 | A | 9/2016 |
| TW | 201725649 | A | 7/2017 |
| WO | 2005048289 | A2 | 5/2005 |
| WO | 2012047428 | A2 | 4/2012 |
| WO | 2018031716 | A1 | 2/2018 |

OTHER PUBLICATIONS

International Search Report and Written Opinion for International Application No. PCT/US2020/037208, mailed on Sep. 23, 2020,14 Pages.

* cited by examiner

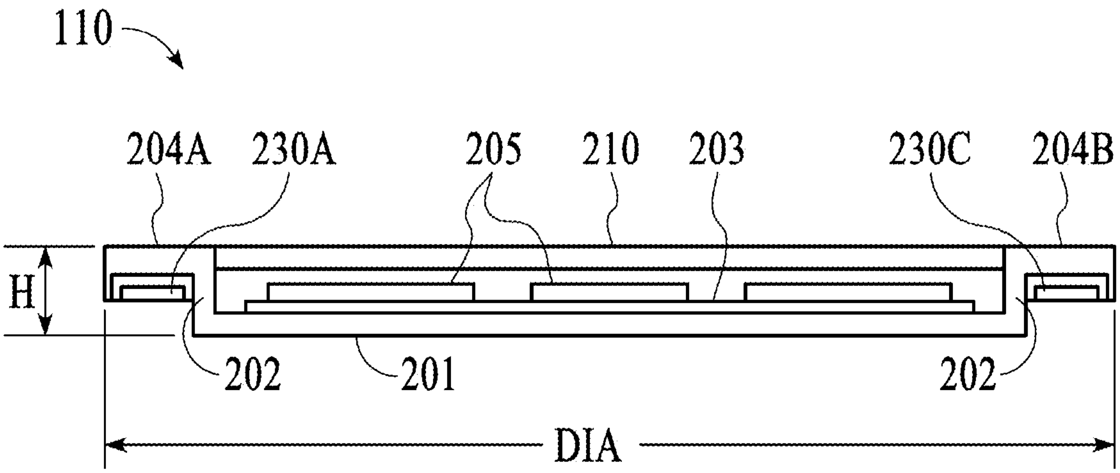
FIG. 2A
FIG. 2B
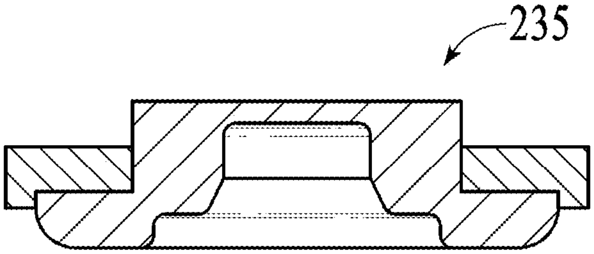
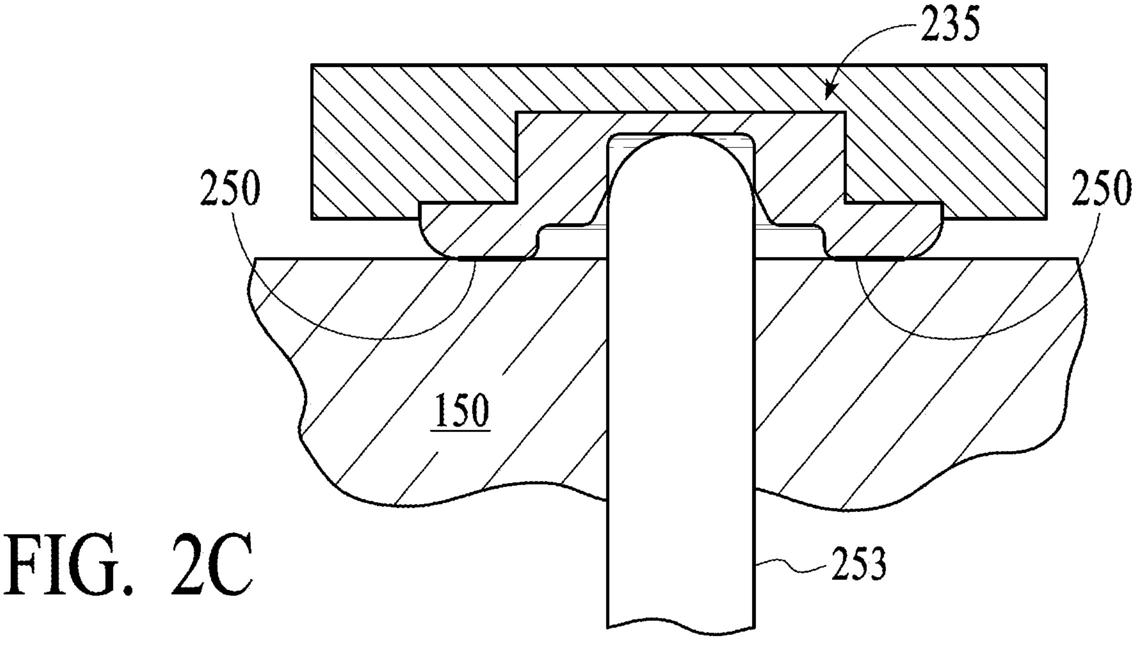
FIG. 2C

DETECTOR FOR PROCESS KIT RING WEAR

RELATED APPLICATIONS

The present application is a division of U.S. patent application Ser. No. 16/946,147, filed Jun. 8, 2020, which claims priority to U.S. Provisional Patent Application No. 62/859,879 filed Jun. 11, 2019, and entitled "DETECTOR FOR PROCESS KIT RING WEAR", which is herein incorporated by this reference in its entirety.

TECHNICAL FIELD

Some embodiments of the present invention relate, in general, to an in-situ process kit ring end of life (EoL) detection apparatus.

BACKGROUND

During plasma processing, energized gas often includes highly corrosive species that etch and erode exposed portions of a processed substrate and components around the processed substrate, including a process kit ring (e.g., a wafer edge ring or more simply "edge ring" and support ring) that sits coplanar to, and surrounds, the substrate. An eroded edge ring is conventionally replaced after a number of process cycles (e.g., hours of processing, referred to as radio frequency (RF) hours) before it contributes to inconsistent or undesirable process results, and before particles eroded from the edge ring contaminate processing in the chamber resulting in particle defects on the substrate. Conventionally, to determine the level of erosion (or wear) of an edge ring and replace the edge ring, a processing chamber is vented and the top source components of plasma etching gas are removed to provide access to the edge ring. This venting and disassembly are not only labor intensive, but hours of productivity of the substrate processing equipment are lost during the procedure. Additionally, exposure of the interior of the processing chamber may cause contamination of the interior, and so a lengthy requalification process for the processing chamber is performed after it is opened.

SUMMARY

Some embodiments described herein cover a method for diagnosing end of life (EoL) of an edge ring and/or other process kit ring and automated replacement of the edge ring and/or other process kit ring. The method may begin with acquiring sensor data of a top surface of a process kit ring disposed within a processing chamber using at least one non-contact sensor. At least a portion of the process kit ring is within a field of view of the at least one non-contact sensor. The method may continue with analyzing, by a computing system, the sensor data to determine a degree of erosion of the top surface of the process kit ring. The method may continue with, in response to determining that the degree of erosion meets an end-of-life (EoL) threshold, initiating automated replacement of the process kit ring.

In some embodiments, the diagnostic disc may have a sidewall around a circumference of the disc and at least one protrusion extending outwardly from a top of the sidewall. A non-contact sensor may be attached to an underside of each of the at least one protrusion. A printed circuit board (PCB) may be positioned within the disc and circuitry may be disposed on the PCB and coupled to each non-contact sensor. The circuitry may include at least a wireless communication circuit, a memory, and a battery. A cover may be positioned over the circuitry inside of the sidewall, wherein the cover is to seal the circuitry within the disc from atmosphere outside of the disc.

In an example embodiment, a processing chamber may include a chamber body. The processing chamber may include a source lid coupled to a top of the chamber body, wherein the chamber body and the source lid together enclose an interior volume. The processing chamber may include a substrate support assembly disposed within the interior volume, the substrate support assembly including a chuck configured to support a substrate in a fixed position during processing of the substrate. The processing chamber may include an edge ring disposed around a circumference of the chuck, wherein at least one of the chamber body or the source lid define an opening at a location that is at least one of above or to a side of the edge ring. The processing chamber may include a non-contact sensor positioned within the opening and within a line of sight of the edge ring, wherein at least a portion of the edge ring is within a field of view of the non-contact sensor. The processing chamber may include a plasma-resistant lens or window disposed at the opening and separating the non-contact sensor from the interior volume, wherein the plasma-resistant lens or window is to protect the non-contact sensor from corrosive gases in the interior volume. The processing chamber may include a computing device operatively coupled to the non-contact sensor. In embodiments, the computing device is to receive sensor data of a top surface of the edge ring from the non-contact sensor; analyze the sensor data to determine a degree of erosion of the top surface of the edge ring; and in response to a determination that the degree of erosion meets an end-of-life (EoL) threshold, initiate automated replacement of the edge ring.

BRIEF DESCRIPTION OF THE DRAWINGS

The present invention is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

FIG. 2A illustrates a side, cross-section view of the diagnostic disc of FIG. 2 according to some aspects of the disclosure.

FIG. 2B illustrates a side, cross-section view of kinematic couplings in the diagnostic disc of FIG. 2 used to engage wafer lift pins of an electrostatic chuck (ESC) according to one aspect of the disclosure.

FIG. 2C illustrates a wafer lift pin setting the diagnostic disc down on the ESC and low contact area between the kinematic couplings and the ESC according to one aspect of the disclosure.

DETAILED DESCRIPTION OF EMBODIMENTS

Figure 1A:
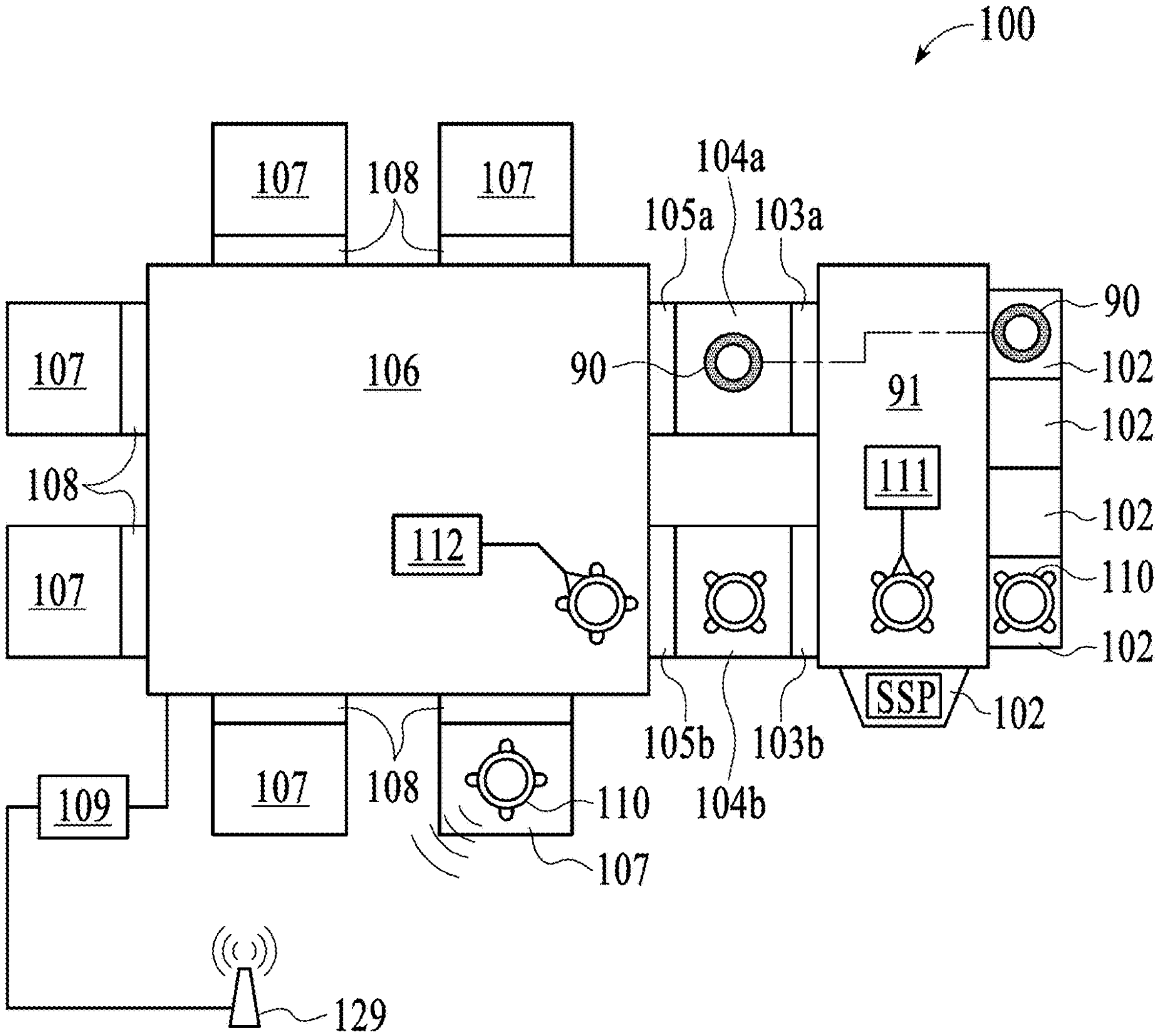
FIG. 1A illustrates a simplified top view of an example processing system, according to one aspect of the disclosure.

Embodiments of the present disclosure provide a closed loop, in-situ system and method for monitoring process edge ring erosion to determine end of life (EoL) of the edge ring and initiate a robot-driven edge replacement process without venting the processing chamber or opening the chamber source lid. In addition to measurement and replacement of an edge ring, other process kit rings may also be measured and/or replaced (e.g., such as a support ring). It should be understood that embodiments described herein with reference to edge rings also apply to other process kit rings in a processing chamber. The term "in-situ" herein means "in place" in the sense that the processing chamber remains intact and the processing chamber need not be disassembled or exposed to atmosphere in order to carry out the disclosed diagnostic and replacement of the edge ring. The disclosed methods and system described in embodiments also provides for support ring flat alignment and centering around a chuck (e.g., an electrostatic chuck (ESC)) on which substrates (e.g., wafers) are held during processing. Embodiments are discussed herein with reference to wafers. However, embodiments also apply to other processed substrates.

One embodiment provides automated replacement of the edge ring without venting the processing chamber, which improves yield of processed wafers and tool time utilization in a customer fabrication facility (fab). Another embodiment additionally or alternatively provides wafer edge tunability for changing the plasma sheath and/or chemistry in a specific location near the wafer edge by moving the edge ring vertically (e.g., so it is or is not co-planar to the wafer surface). Such embodiments benefit from an in-situ diagnostics method to determine edge ring wear (by erosion and/or corrosion) and replacement with a new edge ring that provides improved process results without the disruption to processing and/or disassembly of a substrate processing system or processing chamber.

Various embodiments may employ a non-contact sensor such as a depth camera or a proximity sensor to monitor and help detect when a degree of erosion on the edge ring is beyond a threshold of wear that indicates its EoL. Image data or sensor data (e.g., data indicating a roughness of the surface of the edge ring) from the non-contact sensor may be sent to a computing system, which may analyze the data to determine whether the level of erosion is within the threshold degree of wear. When the erosion wear is beyond this EoL threshold, the disclosed system may initiate an automated swapping out of the worn edge ring with a new edge ring.

In one embodiment, one or more non-contact sensor is included on a diagnostics disc that is adapted to be about the same size as a wafer and to be passed into and out of the processing chamber(s) with the same robotic motions as used to pass wafers. The diagnostics disc may wirelessly transmit the sensor data to the computing system. In another embodiment, a non-contact sensor (e.g., a high resolution depth camera) is disposed within an endpoint window or a top source gas nozzle hole to monitor the edge ring erosion. The sensor data may be transmitted wired or wirelessly from the this stationary non-contact sensor to the computing system. Both of these approaches advantageously avoid venting of the processing chamber or disassembly of the processing chamber, e.g., by removing the top source components of plasma etching gas. This process saves precious man hours as well as avoids down time of the substrate processing system. Additionally, embodiments prevent exposure of an interior of the processing chamber to atmosphere or an external environment, which mitigates contamination of the processing chamber. Furthermore, embodiments enable the condition of an edge ring to be tracked, and enable the edge ring to be replaced at an appropriate time based on empirical data rather than based on guesswork.

FIG. 1A illustrates a simplified top view of an example processing system 100, according to one aspect of the disclosure. The processing system 100 includes a factory interface 91 to which a plurality of substrate cassettes 102 (e.g., front opening unified pods (FOUPs) and a side storage pod (SSP)) may be coupled for transferring substrates (e.g., wafers such as silicon wafers) into the processing system 100. In embodiments, the substrate cassettes 102 include, in addition to wafers, edge rings 90 (e.g., new edge rings) and diagnostics discs 110. Diagnostic discs 110 may be used to diagnose the EoL of the edge ring currently in operation within one or more processing chamber 107. The factory interface 91 may also transfer the edge rings 90 and the diagnostic discs 110 into and out of the processing system 100 using the same functions for transferring wafers as will be explained.

The processing system 100 may also include first vacuum ports 103*a*, 103*b* that may couple the factory interface 91 to respective stations 104*a*, 104*b*, which may be, for example, degassing chambers and/or load locks. Second vacuum ports 105*a*, 105*b* may be coupled to respective stations 104*a*, 104*b* and disposed between the stations 104*a*, 104*b* and a transfer chamber 106 to facilitate transfer of substrates into the transfer chamber 106. The transfer chamber 106 includes multiple processing chambers 107 (also referred to as process chambers) disposed around the transfer chamber 106 and coupled thereto. The processing chambers 107 are coupled to the transfer chamber 106 through respective ports 108, such as slit valves or the like.

The processing chambers 107 may include one or more of etch chambers, deposition chambers (including atomic layer deposition, chemical vapor deposition, physical vapor deposition, or plasma enhanced versions thereof), anneal chambers, and the like. Some of the processing chambers 107, such as etch chambers, may include edge rings (also referred to as wafer edge rings or process kit rings) therein, which occasionally undergo replacement. While replacement of edge rings in conventional systems includes disassembly of a processing chamber by an operator to replace the edge ring, the processing system 100 is configured to facilitate replacement of edge rings without disassembly of a processing chamber 107 by an operator.

In various embodiments, the factory interface 91 includes a factory interface robot 111. The factory interface robot 111 may include a robot arm, and may be or include a selective compliance assembly robot arm (SCARA) robot, such as a 2 link SCARA robot, a 3 link SCARA robot, a 4 link SCARA robot, and so on. The factory interface robot 111 may include an end effector on an end of the robot arm. The end effector may be configured to pick up and handle specific objects, such as wafers. Alternatively, the end effector may be configured to handle objects such as diagnostic discs and edge rings. The factory interface robot 111 may be configured to transfer objects between substrate cassettes 102 (e.g., FOUPs and/or SSP) and stations 104*a*, 104*b*.

The transfer chamber 106 includes a transfer chamber robot 112. The transfer chamber robot 112 may include a robot arm with an end effector at an end of the robot arm. The end effector may be configured to handle particular objects, such as wafers, edge rings, ring kits, and diagnostic discs. The transfer chamber robot 112 may be a SCARA robot, but may have fewer links and/or fewer degrees of freedom than the factory interface robot 111 in some embodiments.

A controller 109 may control various aspects of the processing system 100 and may include or be coupled to a wireless access point (WAP) device 129. The WAP device 129 may include wireless technology and one or more antenna with which to communicate with the diagnostic discs 110. The controller 109 may be and/or include a computing device such as a personal computer, a server computer, a programmable logic controller (PLC), a microcontroller, and so on. The controller 109 may include one or more processing devices such as a microprocessor, central processing unit, or the like. More particularly, the processing device may be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processing device may also be one or more special-purpose processing devices such as an application specific integrated circuit (ASIC), a field programmable gate array (FPGA), a digital signal processor (DSP), network processor, or the like.

Although not illustrated, the controller 109 may include a data storage device (e.g., one or more disk drives and/or solid state drives), a main memory, a static memory, a network interface, and/or other components. The controller 109 may execute instructions to perform any one or more of the methodologies and/or embodiments described herein, including image or sensor data processing and analysis, image processing algorithm, machine learning (ML) algorithms that generate one or more trained machine learning model, deep ML algorithms, and other imaging algorithms for analyzing surface sensor data in detecting degrees of erosion of edge rings in operation within the processing chambers 107. The instructions may be stored on a computer readable storage medium, which may include the main memory, static memory, secondary storage and/or processing device (during execution of the instructions). In some embodiments, training data to train a ML model may be obtained by imaging, using a scanning device or other type of sensor or camera, edge rings that have already been removed and determined to have an EoL threshold of erosion wear.

Figure 1B:
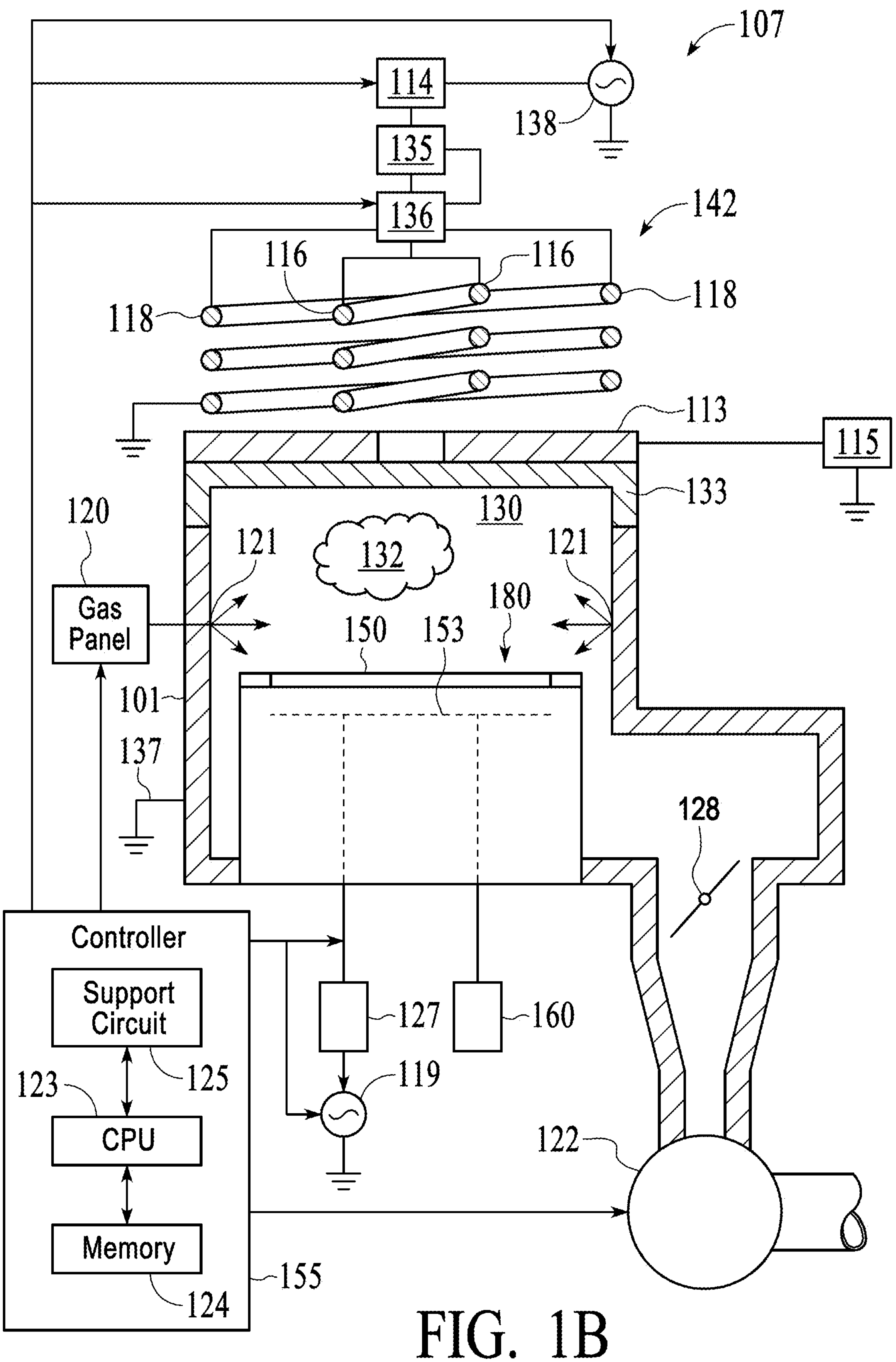
FIG. 1B illustrates a schematic cross-sectional side view of a processing chamber of FIG. 1A according to one aspect of the disclosure.

FIG. 1B illustrates a schematic cross-sectional side view of a processing chamber 107 of FIG. 1A according to one aspect of the disclosure. The process chamber 107 includes a chamber body 101 and a lid 133 disposed thereon that together define an inner volume. The chamber body 101 is typically coupled to an electrical ground 137. A substrate support assembly 180 is disposed within the inner volume to support a substrate thereon during processing. The process chamber 107 also includes an inductively coupled plasma apparatus 142 for generating a plasma 132 within the process chamber 107, and a controller 155 adapted to control examples of the process chamber 107.

The substrate support assembly 180 includes one or more electrodes 153 coupled to a bias source 119 through a matching network 127 to facilitate biasing of the substrate during processing. The bias source 119 may illustratively be a source of up to about 1000 W (but not limited to about 1000 W) of RF energy at a frequency of, for example, approximately 13.56 MHz, although other frequencies and powers may be provided as desired for particular applications. The bias source 119 may be capable of producing either or both of continuous or pulsed power. In some examples, the bias source 119 may be a DC or pulsed DC source. In some examples, the bias source 119 may be capable of providing multiple frequencies. The one or more electrodes 153 may be coupled to a chucking power source 160 to facilitate chucking of the substrate during processing. The substrate support assembly 180 may include a process kit (not shown) surrounding the substrate. Various embodiments of the process kit are described below.

The inductively coupled plasma apparatus 142 is disposed above the lid 133 and is configured to inductively couple RF power into the process chamber 107 to generate a plasma within the process chamber 107. The inductively coupled plasma apparatus 142 includes first and second coils 116, 118, disposed above the lid 133. The relative position, ratio of diameters of each coil 116, 118, and/or the number of turns in each coil 116, 118 can each be adjusted as desired to control the profile or density of the plasma being formed. Each of the first and second coils 116, 118 is coupled to an RF power supply 138 through a matching network 114 via an RF feed structure 136. The RF power supply 138 may illustratively be capable of producing up to about 4000 W (but not limited to about 4000 W) at a tunable frequency in a range from 50 kHz to 13.56 MHz, although other frequencies and powers may be utilized as desired for particular applications.

In some examples, a power divider 135, such as a dividing capacitor, may be provided between the RF feed structure 136 and the RF power supply 138 to control the relative quantity of RF power provided to the respective first and second coils. In some examples, the power divider 135 may be incorporated into the matching network 114.

A heater element 113 may be disposed on top of the lid 133 to facilitate heating the interior of the process chamber 107. The heater element 113 may be disposed between the lid 133 and the first and second coils 116, 118. In some examples, the heater element 113 may include a resistive heating element and may be coupled to a power supply 115, such as an AC power supply, configured to provide sufficient energy to control the temperature of the heater element 113 within a desired range.

During operation, the substrate, such as a semiconductor wafer or other substrate suitable for plasma processing, is placed on the substrate support assembly 180 and process gases supplied from a gas panel 120 through entry ports 121 into the inner volume of the chamber body 101. The process gases are ignited into the plasma 132 in the process chamber 107 by applying power from the RF power supply 138 to the first and second coils 116, 118. In some examples, power from a bias source 119, such as an RF or DC source, may also be provided through a matching network 127 to electrodes 153 within the substrate support assembly 180. The pressure within the interior of the process chamber 107 may be controlled using a valve 128 and a vacuum pump 122. The temperature of the chamber body 101 may be controlled using liquid-containing conduits (not shown) that run through the chamber body 101.

The process chamber 107 includes a controller 155 to control the operation of the process chamber 107 during processing. The controller 155 comprises a central processing unit (CPU) 123, a memory 124, and support circuits 125 for the CPU 123 and facilitates control of the components of the process chamber 107. The controller 155 may be one of any form of general-purpose computer processor that can be used in an industrial setting for controlling various chambers and sub-processors. The memory 124 stores software (source or object code) that may be executed or invoked to control the operation of the process chamber 107 in the manner described herein.

Figure 2:
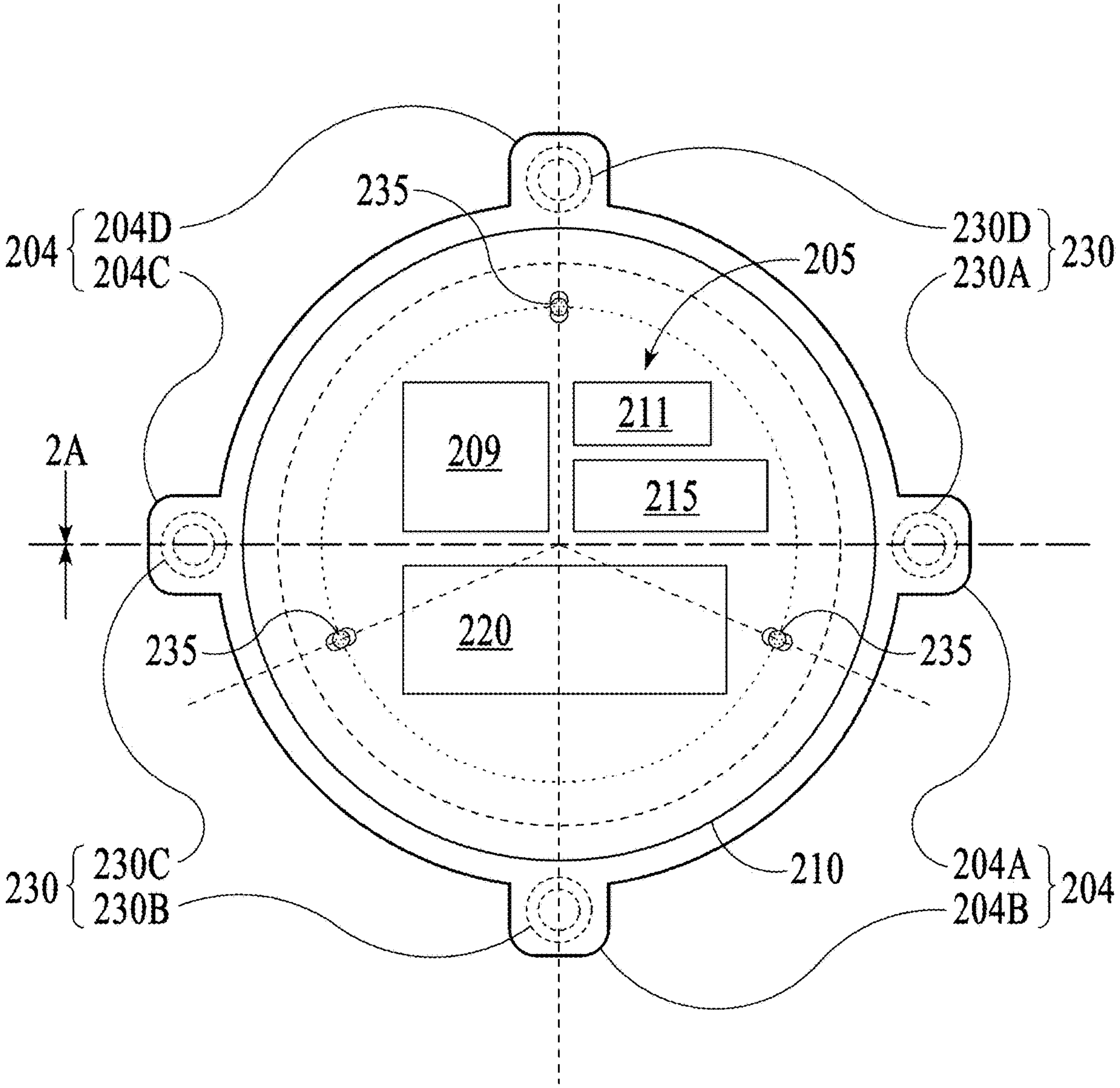
FIG. 2 illustrates a top plan view of a diagnostic disc according to one aspect of the disclosure.

FIG. 2 illustrates a top plan view of a diagnostic disc 110 according to one aspect of the disclosure. FIG. 2A illustrates a side, cross-section view of the diagnostic disc 110 of FIG. 2 along the line "2A" according to some aspects of the disclosure. The diagnostic disc 110 may include a disc body 201 with a sidewall 202 around a circumference of the disc body 201, and at least one protrusion 204 extending outwardly from a top of the sidewall 202. In the depicted embodiment, there are four protrusions, e.g., a first protrusion 204A, a second protrusion 204B, a third protrusion 204C, and a fourth protrusion 204D, each spaced at about 90 degrees from adjacent protrusions and each being positioned approximately perpendicular to the sidewall 202. The diagnostic disc 110 includes greater or fewer numbers of protrusions in various embodiments. In an alternative embodiments, the diagnostic disc 110 has no protrusions and is shaped as a solid disc similar to a wafer.

In embodiments, the diagnostic disc 110 further includes a printed circuit board (PCB) 203 disposed on an upper side of the disc body 201, e.g., within an interior formed by the disc body 201 and the sidewall 202. Circuitry 205 may be disposed on the PCB, and may include a number of components, such for example, on-board controls 209, memory 211 or other on-board computer storage, a wireless communications circuit 215, and a battery 220. A cover 210 may be disposed over the circuitry 205 within the sidewall, which may be used to vacuum seal the circuitry 205.

In various embodiments, a non-contact sensor 230 is attached to an underside of each of the at least one protrusion 204. For example, the diagnostic disc 110 may further include a number of non-contact sensors such as a first non-contact sensor 230A, a second non-contact sensor 230B, a third non-contact sensor 230C, and a fourth non-contact sensor 230D attached to an underside of the four protrusions 204A, 204B, 204C, and 204D, respectively. In the embodiment with no protrusions, each non-contact sensor 230 is attached to an underside of the periphery of the diagnostic disc 110 so that each non-contact sensor 230 can be oriented over an edge ring or process kit ring. Each non-contact sensor 230 may be coupled (e.g., through the sidewall 202), to the circuitry 205, e.g., via a connection on the PCB 203. Each non-contact sensor 230 may be configured to acquire sensor data of a portion of the surface (e.g., texture and/or roughness information indicative of erosion) of the edge ring being used in any given processing chamber 107. The wireless communication circuit 215 may include or be coupled to an antenna in order to wirelessly transmit the sensor data to the controller 109. In alternative embodiments, the sensor data is stored in the memory 211 and retrieved later after being extracted from the factory interface, e.g., from one of the substrate cassettes 102.

In varying embodiments, the non-contact sensor 230 is an image sensor such as a camera having a zoom of at least four times magnification (e.g., 4×, 6×, 8×, or more). For example, the non-contact sensor 230 may be or include a charge-coupled device (CCD) camera and/or a complementary metal oxide (CMOS) camera or a high resolution camera. Alternatively, the cameras may have other zoom capabilities. Alternatively, the non-contact sensor 230 may be a miniature radar sensor that can scan a surface of the edge ring. Further, the non-contact sensor 230 may include an x-ray emitter (e.g., an x-ray laser) and an x-ray detector. The non-contact sensor 230 may alternatively be or include one or more pairs of a laser emitter that generates a laser beam and a laser receiver that receives the laser beam. A sensor measurement may be generated by a pair of a laser emitter and a laser receiver when the laser beam is reflected off of a surface of the edge ring. These sensor measurements may be translated into sensor data by the circuitry 205 and/or the controller 109 in various embodiments.

With additional reference to FIG. 2A, a diameter (DIA) of the diagnostic disc 110 may be defined by outer perimeters of two opposing protrusions, such as from an edge of the first protrusion 204A to an edge of the third protrusion 204C. The diameter may be between about 13 inches to about 14 inches, or within 10-15 percent of 300 millimeters in some embodiments. Further, a diameter of the disc body 201 may be approximately 11.5 inches to 12.25 inches, where each of the at least one protrusion 204 protrudes by about ten percent of the diameter such that an area from between approximately 6.5 inches and 6.75 inches from a center of the disc body 201 is within a field of view of each non-contact sensor 230.

Further, each non-contact sensor 230 may be positioned such that a gap is formed between the non-contact sensor and the bottom of the disc body 201. For example, each non-contact sensor 230 may be positioned on a respective protrusion 204 such that a vertical distance between the non-contact sensor 230 and a bottom of the disc body 201 displaces the non-contact sensor 230 from a surface that the diagnostic disc is placed upon. The height of the diagnostic disc 110 may be defined by the height (H) of the sidewall 202, which may be between 0.35 inches and 0.45 inches. In one embodiment, the height of the diagnostic disc 110 is about 0.390 inches. In varying embodiments, the disc body 201, including the sidewall 202, and the cover 210 may be made of carbon fiber or aluminum with a coating made of one of anodized aluminum ($Al_2O_3$), ceramic, or yttria.

Figure 3:
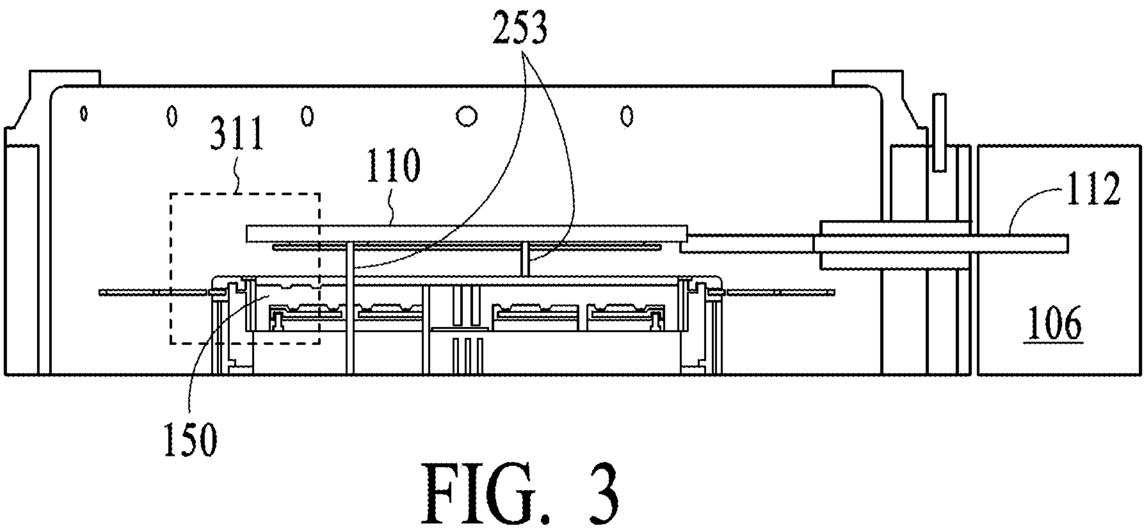
FIG. 3 illustrates a side, cross-section view of diagnostic disc being placed on wafer lift pins of an electrostatic chuck (ESC) of a processing chamber according to an aspect of the disclosure.

In some embodiments, the diagnostic disc 110 further includes multiple kinematic couplings 235 disposed on a bottom surface of the disc body 201. The kinematic couplings 235 may be configured as sloped holes or slots to receive (or engage) wafer lift pins (253 in FIGS. 2C-3) of an electrostatic chuck (ESC) located within a processing chamber. FIG. 2B illustrates a side, cross-section view of the kinematic couplings 235 in the diagnostic disc 110 of FIG. 2. Kinematic couplings are fixtures designed to exactly constrain a part (e.g., the wafer lift pins) by providing precision and certainty of location, here the holes or slots of the kinematic couplings 235 sized with a pin circle diameter (PCD) of the wafer lift pins (FIG. 3). The kinematic couplings 235 may thus center the diagnostic disc 110 over an edge ring so that the non-contact sensors are generally oriented over the edge ring being imaged or scanned. In one embodiment, there are three kinematic couplings spaced 120 degrees apart and located about two-thirds of a distance along a radius of the disc body 201.

FIG. 2C illustrates a wafer lift pin 253 setting the diagnostic disc 110 down on the ESC 150 and a low contact area (LCA) 250 between the kinematic couplings 235 and the ESC 150 according to one aspect of the disclosure. As illustrated, the kinematic couplings 235 may provide a draft angle for easy lift engagement by the lift pins 253. In various embodiments, the kinematic couplings are made of one of vaspel, carbon fiber, rexolite, or polyetheretherketone (PEEK). Because the kinematic couplings 235 are not metal and touch the surface of the ESC 150, the diagnostic disc 110 avoids scratching or damaging the ESC 150. The LCA 250 and material of the kinematic couplings 235 may also help reduce particle generation and contamination.

In various embodiments, the controller 109 (e.g., computing system) may receive signals from and send controls to the factory interface robot 111, the wafer transfer chamber robot 112, and/or each non-contact sensor 230. In this way, the controller 109 may initiate diagnostics in which, for example, the edge ring in one of the processing chambers 107 has been under operation for from between about 300-400 RF hours. The controller 109 may signal the factory interface robot 111 to pick up one of the diagnostic discs 110 from one of the substrate cassettes 102 and transfer the diagnostic disc 110 to, e.g., the station 104*b*, which may be a load lock or a degas chamber, for example. Thereafter, the transfer chamber robot 112 may pick up, e.g., with an end effector of a robot arm, the diagnostic disc 110 and place the diagnostic disc 110 in the processing chamber 107 where it may acquire sensor data for purposes of determining a degree if erosion of a surface of the edge ring. The sensor data may be transmitted wirelessly, e.g., using the wireless communication circuit 215, to the controller 109 via the WAP device 129.

FIG. 3 illustrates a side, cross-section view of the diagnostic disc 110 being placed on wafer lift pins 253 of an ESC 150 of a processing chamber according to an aspect of the disclosure. The diagnostic disc 110 is illustrated setting on top of an end effector (e.g., a robot blade) of the robot arm of the transfer chamber robot 112 located within the transfer chamber 106. An area 311 around the left portion of the ESC 150 where a part of the edge ring resides has been encircled, which area 311 is enlarged in FIGS. 3A-3B.

Figure 3A:
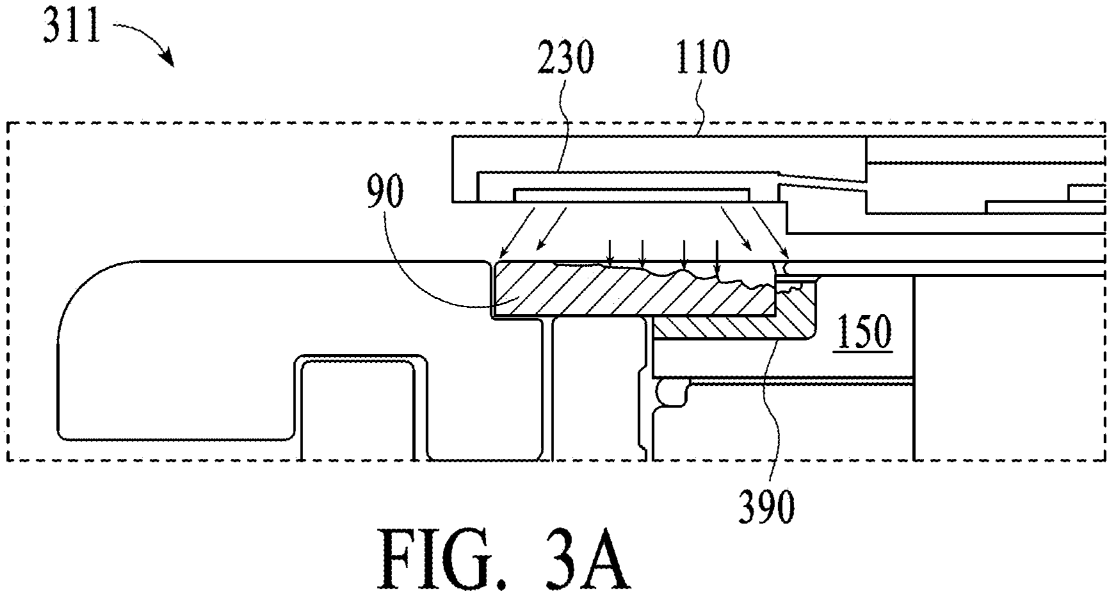
FIG. 3A is an exploded view of a portion of the diagnostic disc of FIG. 3 in which a high resolution camera captures sensor data of the edge and support rings according to an aspect of the disclosure.

FIG. 3A is an exploded view of a portion of the diagnostic disc 110 of FIG. 3 in which the non-contact sensor 230 is a high resolution camera that captures sensor data of the edge and support rings according to an aspect of the disclosure. The wafer lift pins 253 illustrated in FIG. 3 may be raised and the end effector of the robot arm of the transfer chamber robot 112 may set the diagnostic disc 110 down on the wafer lift pins 253. The kinematic couplings 235 on the diagnostic disc may ensure that the wafer lift pins are forced to center the diagnostic disc over the ESC 150 such that each non-contact sensor 230 is positioned vertically on top of the edge ring 90. In one embodiment, the wafer lift pins 253 are only slightly raised so that the non-contact sensor 230 leaves a smaller gap to the edge ring 90. While the diagnostic disc 110 rests on the wafer lift pins 253, the non-contact sensor 230 may acquire sensor data in any of the methods discussed previously and wirelessly communicate the sensor data to the controller 109.

Figure 3B:
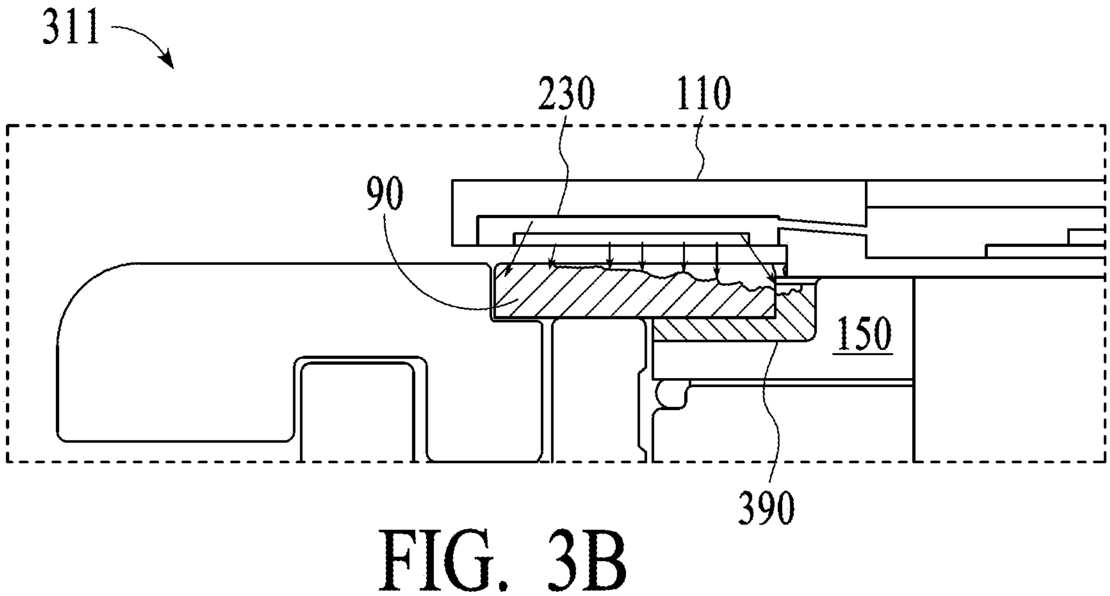
FIG. 3B is an exploded view of a portion of the diagnostic disc of FIG. 3 in which a non-contact sensor captures sensor data of the edge and support rings according to an aspect of the disclosure.

FIG. 3B is an exploded view of a portion of the diagnostic disc 110 of FIG. 3 in which each non-contact sensor 230 captures sensor data of the edge ring 90 and the support ring 390 according to an aspect of the disclosure. In this embodiment, the wafer lift pins 253 may be lowered so that the diagnostic disc 110 rests on top of the ESC 150. In another embodiment, another mechanism is used to guide the diagnostic disc 110 onto the ESC 150 such as with use of sensor data from the non-contact sensors. Each non-contact sensor 230 is brought within close proximity of the edge ring 90, but still retaining a gap between the non-contact sensor 230 and the edge ring 90. While the diagnostic disc 110 rests on the ESC 150, the non-contact sensor 230 may acquire sensor data in any of the methods discussed previously and wirelessly communicate the sensor data to the controller 109.

As observed in FIGS. 3A-3B, a support ring 390 located underneath the edge ring 90 and between the edge ring 90 and the ESC 150 may also have erosion (or wear) when the erosion of the edge ring 90 is sufficiently deep. Accordingly, when the edge ring 90 is replaced, the support ring 390 may also be replaced at the same time, e.g., as a process kit ring. Thus, when reference is made to replacement of an edge ring 90, this should also be understood to making reference to replacement of the process kit ring, and vice versa.

Figure 4:
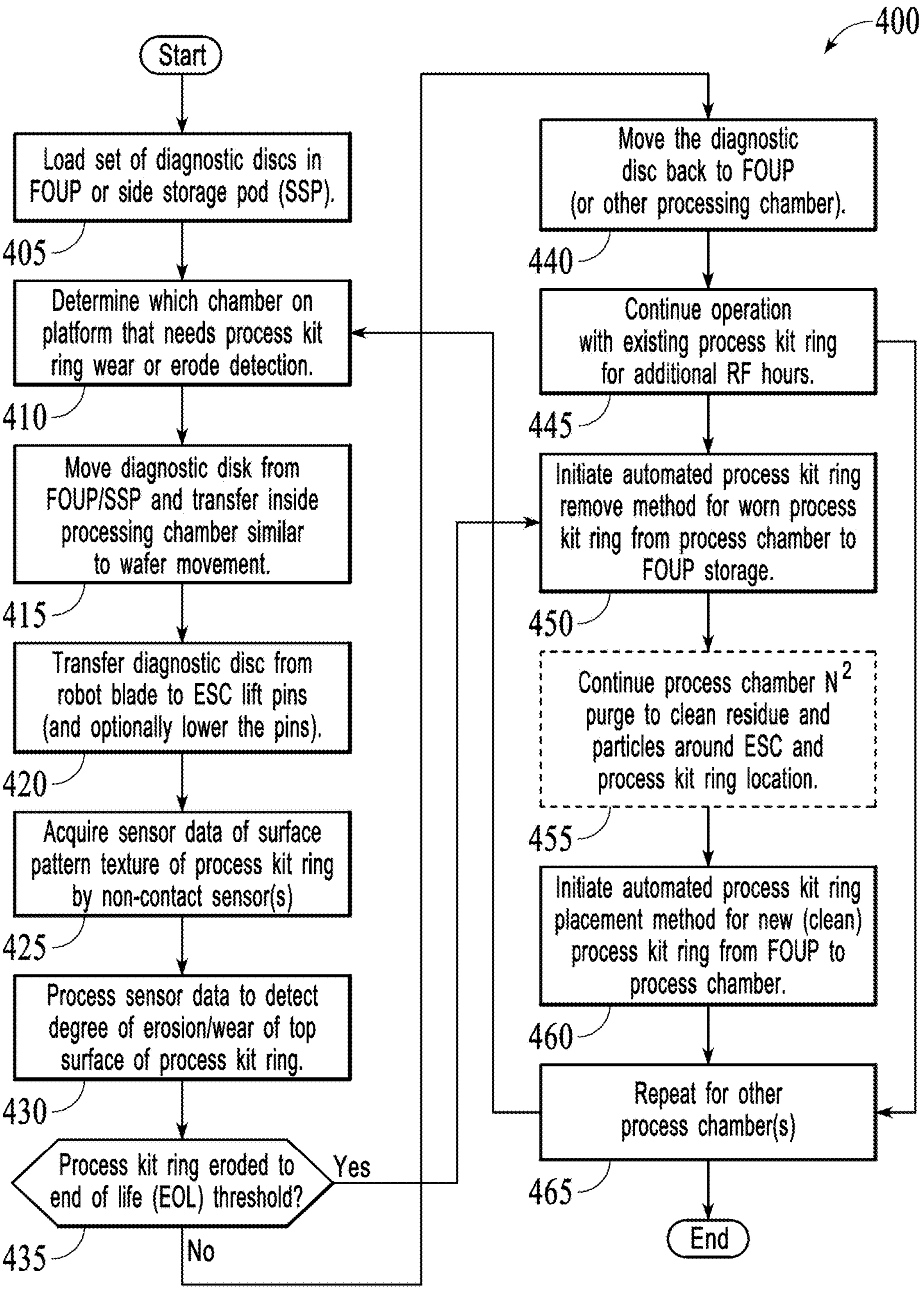
FIG. 4 is a flow chart of a method for using a diagnostic disc for diagnosing end-of-life (EoL) wear of an edge (or process kit) ring and initiating replacement of process kit ring according various aspects of the disclosure.

FIG. 4 is a flow chart of a method 400 for using a diagnostic disc for diagnosing end-of-life (EoL) wear of an edge (or process kit) ring and initiating replacement of process kit ring according various aspects of the disclosure. Some operations of method 400 may be performed by processing logic that may include hardware (circuitry, dedicated logic, etc.), software (such as is run on a general purpose computer system or a dedicated machine), firmware, or some combination thereof. Some operations of method 400 may be performed by a computing device, such as the controller 109 of FIG. 1, that is in control of a robot arm and/or a non-contact sensor. For example, processing logic that performs one or more operations of method 400 may execute on the controller 109.

For simplicity of explanation, the methods are depicted and described as a series of acts. However, acts in accordance with this disclosure can occur in various orders and/or concurrently, and with other acts not presented and described herein. Furthermore, not all illustrated acts may be performed to implement the methods in accordance with the disclosed subject matter. In addition, those skilled in the art will understand and appreciate that the methods could alternatively be represented as a series of interrelated states via a state diagram or events.

With reference to FIG. 4, the method 400 may being with the processing logic loading one or a set of diagnostic discs 110 within one of the substrate cassettes 102 (such as a FOUP or SSP) (405). In one embodiment, one or more diagnostic disc is stored in a FOUP that also contains edge rings, or more generally, a process kit ring. In one embodiment, multiple diagnostic discs are stored in a FOUP designed to house diagnostic discs. The method 400 may continue with the processing logic determining that the process kit ring in a processing chamber 107 is due for a diagnostic scan based on a number of RF hours (e.g., 300-400 or more) of operation of the processing chamber within a substrate processing system (410) and/or based on other criteria (e.g., an amount of time that has passed since a last analysis was performed of the process kit ring in a processing chamber). At least a portion of the process kit ring is within a field of view of the at least one non-contact sensor 230.

The method 400 may continue with the processing logic moving one of the diagnostic discs 110 from the FOUP (or SSP) to the processing chamber with similar movement as used to move a wafer (415). In embodiments, these movements include loading a diagnostic disc 110 from a wafer storage area into a load lock of the substrate processing system (e.g., by the factor interface robot 111) and moving, using an end effector of a robot arm within a transfer chamber, the diagnostic disc from the load lock to the processing chamber (e.g., by the transfer chamber robot 112). This may include picking up and placing, using an end effector of a robot arm within the transfer chamber 106, the diagnostic disc 110 into the processing chamber.

With additional reference to FIG. 4, the method 400 may continue with processing logic transferring (or moving) the diagnostic disc 110 from the end effector of the robot arm to the wafer lift pins 253 of the ESC 150 (FIG. 3A) (420). In one embodiment, the method 400 may further include lowering the wafer lift pins, e.g., to set the diagnostic disc 110 on the ESC (FIG. 3B) (420). The method 400 may further include the processing logic acquiring sensor data of a top surface of the process kit ring using at least one non-contact sensor 230 of the diagnostic disc positioned over the process kit ring (425). The sensor data may be acquired while the diagnostic disc 110 is still on the wafer lift pins 253 or after the diagnostic disc 110 has been lowered to the ESC 150.

With additional reference to FIG. 4, in various embodiments, the method 400 further includes the processing logic analyzing the sensor data to determine a degree of erosion of the top surface of the process kit ring, which was discussed in more detail previously (430). The method 400 may further include the processing logic determining whether the degree or erosion meets an EoL threshold of erosion or wear (435). If the EoL threshold has not been reached, the method 400 may continue with the processing logic moving the diagnostic disc 110 back to the storage area (e.g., the FOUP or SSP) (440) and continuing with substrate processing for an additional number of RF hours before again acquiring new sensor data of the top surface of the process kit ring (445).

If, however, the EoL threshold has been met, the method 400 may continue with the processing logic initiating automated worn process kit ring removal, e.g., by removing the worn process kit ring from the processing chamber back to the storage area (e.g., the FOUP or SSP) (450). The method 400 may optionally continue with the processing logic purging, using a pressurized gas source (e.g., nitrogen) of the processing chamber, residue and particles surrounding an electrostatic chuck adjacent to the (now removed) worn process kit ring (455). The method 400 may continue with the processing logic initiating automated process kit ring replacement, e.g., by moving a new process kit ring from the storage area into the processing chamber as replacement for the worn process kit ring (460). This may include placing a new process kit ring into the processing chamber using the end effector of the robot arm. The functionality of the method 400 may be repeated for additional process kit rings in additional processing chambers (465).

Figure 5A:
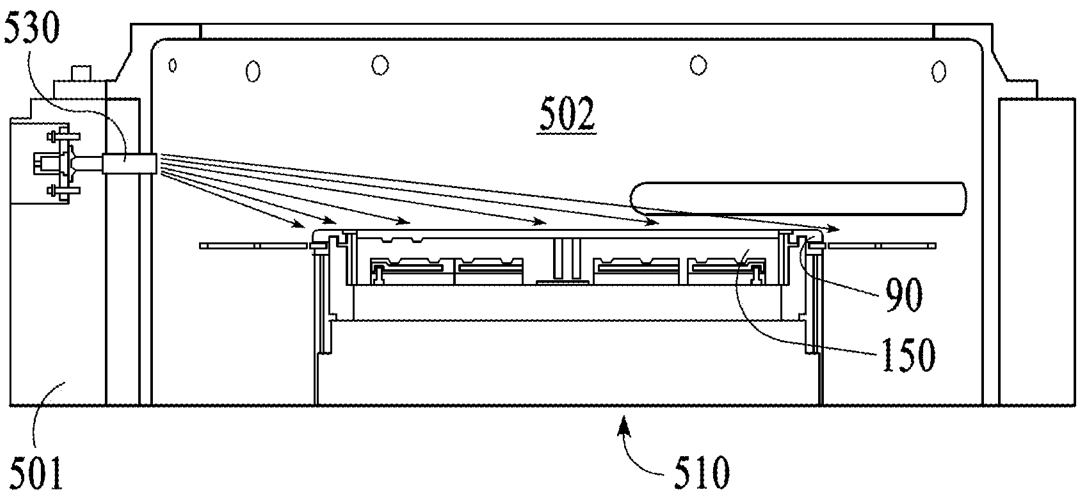
FIGS. 5A-5B illustrate a set of side, cross-section views of a processing chamber through which a non-contact sensor is located in an end-point window for imaging the edge ring according an aspect of the disclosure.
Figure 5B:
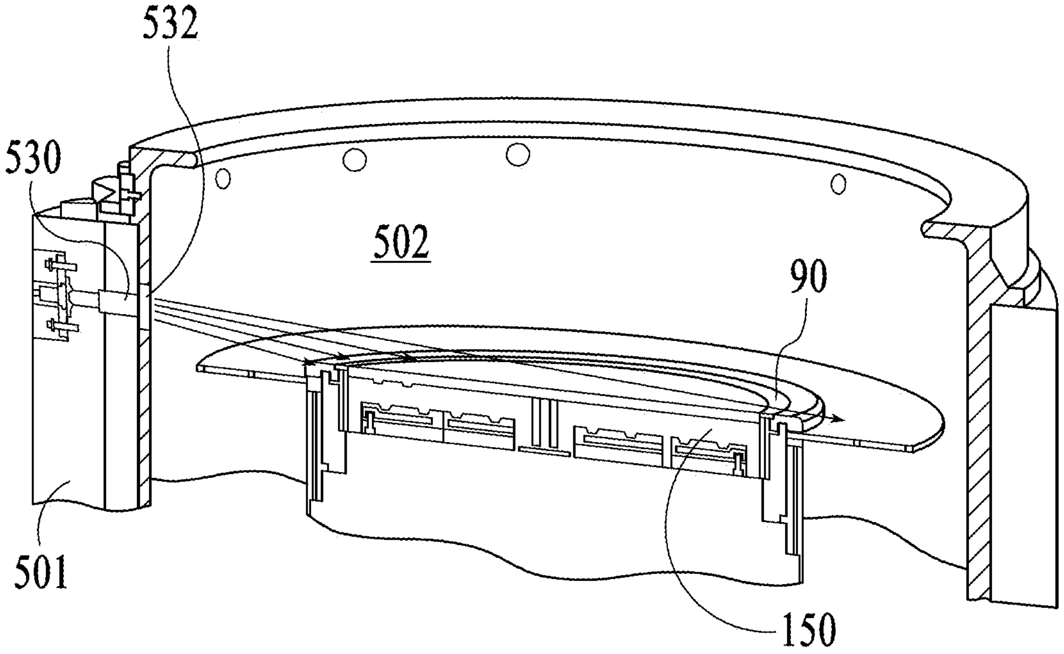

FIGS. 5A-5B illustrate a set of side, cross-section views of a processing chamber 507 through which a non-contact sensor 530 is located in an end-point window for imaging the edge ring (or process kit ring) according an aspect of the disclosure. The processing chamber 507 may be identical or similar to the processing chamber 107 of FIG. 1. The processing chamber 507 may include a chamber body 501, a plasma-resistant liner 502 layered inside the body 501, and a chuck 150 (e.g., an ESC 150). The processing chamber 507 further includes a substrate support assembly 510 in the interior volume of the processing chamber 507 on which is disposed the chuck 150. The chuck 150 is to clamp in place (or retain in a fixed position) a wafer during semiconductor processing, according to embodiments of the disclosure. An edge ring 90 (or process kit ring) may be disposed around a circumference of the chuck 150, optionally coplanar with the chuck 150.

In one embodiment, a sidewall of the chamber body 501 defines an opening at a location that is to a side of the edge ring 90 (or process kit ring). The plasma resistant liner 502 may include an additional opening that approximately lines up with the opening in the sidewall of the chamber body, e.g., such that the opening and additional opening is continuous from the outside of the chamber body 501 to an inside of the plasma-resistant liner 502. In this embodiment, the opening and the additional opening define an endpoint window for the processing chamber 507, although other windows/openings are envisioned.

At least a portion of a non-contact sensor 530 (which may be the same or similar to the non-contact sensor 230, such as a high resolution camera) may be positioned within the additional opening within a line of sight of the edge ring 90. In other words, at least a portion of the edge ring 90 may be in a field of view of the non-contact sensor 530. A front of the non-contact sensor 530 may be located flush with an inside surface of the plasma-resistant liner 502 so that there is a clear line of sight of the edge ring 90. Use of a fish-eye lens (with wide-angle view) within the non-contact sensor 530 may help with providing a good line of sight to the edge ring 90. The non-contact sensor 530 may be coupled to the controller 109, e.g., a computing system.

A plasma-resistant lens or window 532 (e.g., hard gemstone lens or window) may be disposed over the non-contact sensor 530 to protect the non-contact sensor 530 from corrosive gases. In varied embodiments, the plasma-resistant lens or window 532 is one of a diamond lens, a corundum lens (e.g., a sapphire lens), or a topaz lens. The non-contact sensor 530 may be vacuum sealed by the plasma-resistant lens or window 532, to keep corrosive gases from contacting the non-contact sensor 530.

Figure 7:
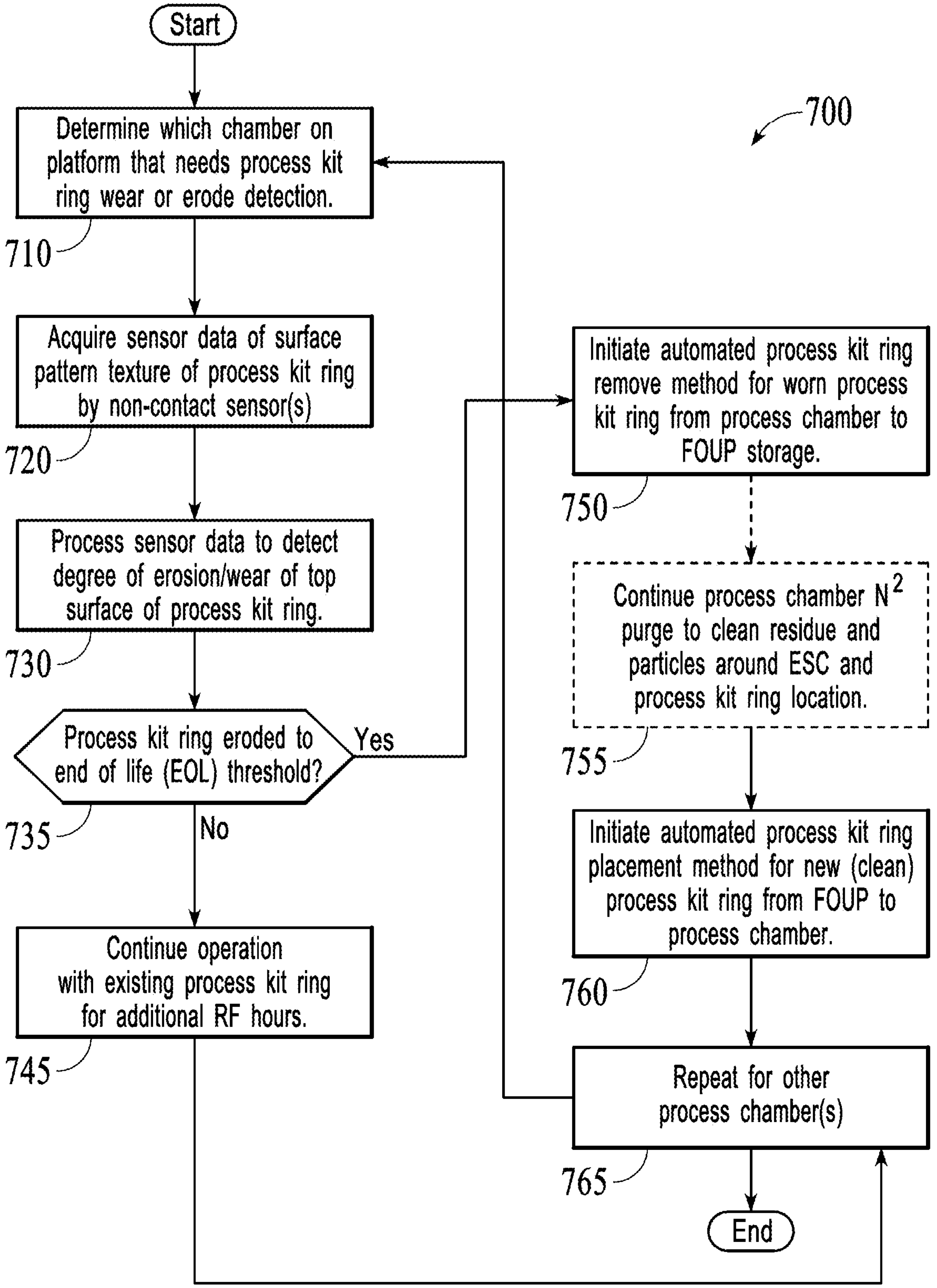
FIG. 7 is a flow chart of a method for using an in-situ non-contact sensor of a processing chamber for diagnosing end-of-life (EoL) wear of an edge (or process kit) ring and initiating replacement of process kit ring according various aspects of the disclosure.

In embodiments, the non-contact sensor 530 may be used instead of the non-contact sensors 230 on the diagnostic disc 110, e.g., by acquiring sensor data of a top surface (which includes edges of) the edge ring 90 as illustrated in FIG. 7. The sensor data may then be transmitted either wirelessly or via a wired connection to the controller 109 for image processing as was discussed previously, to determine whether the erosion of the edge ring is within a threshold degree of erosion to be classified as "end of life."

Figure 6:
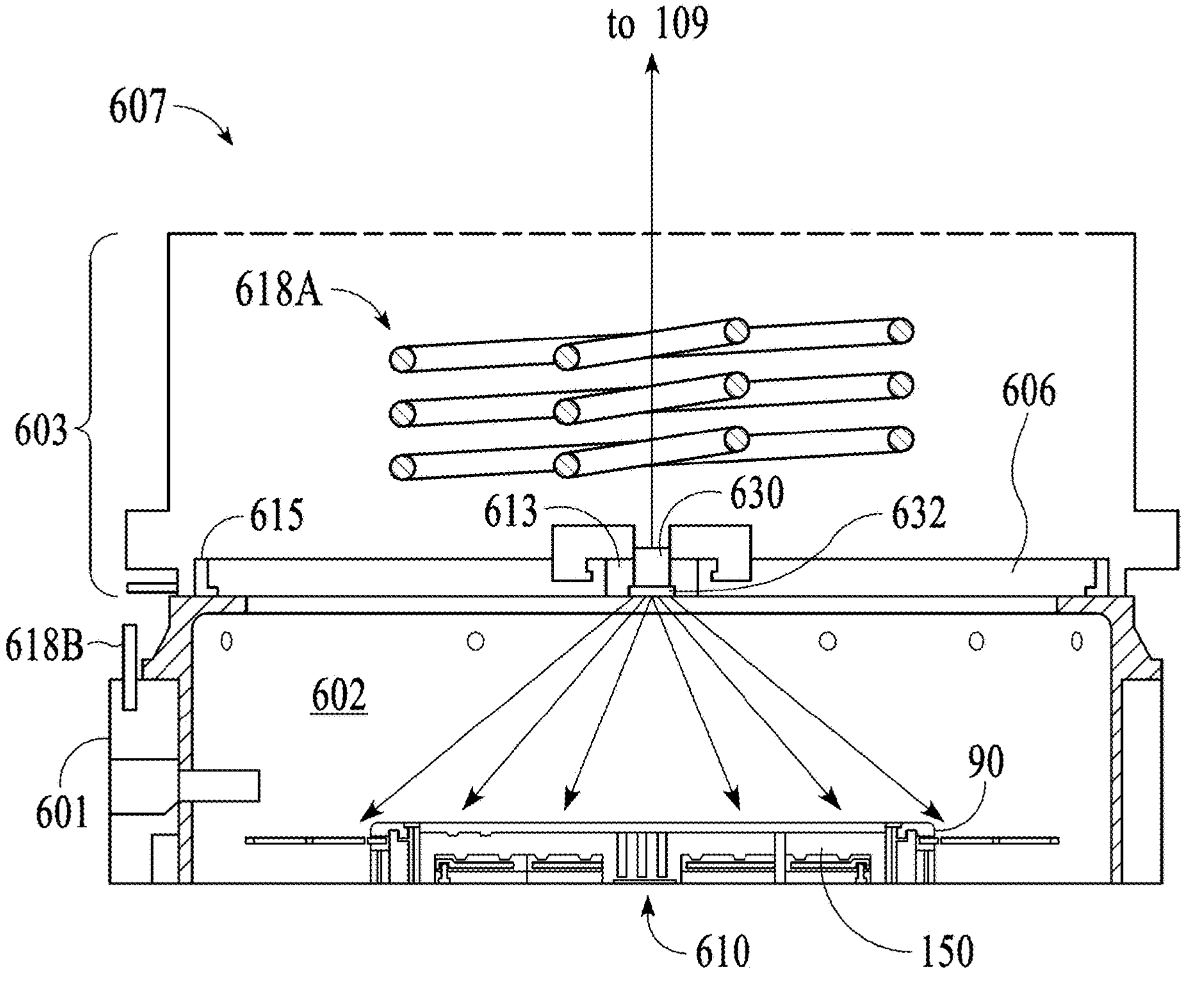
FIG. 6 illustrates a side, cross-section view of a processing chamber in which a non-contact sensor is located at a top center gas nozzle for imaging the edge ring according to an aspect of the disclosure.

FIG. 6 illustrates a side, cross-section view of a processing chamber 607 in which a non-contact sensor 630 is located at a top center gas nozzle 613 for imaging the edge ring 90 (or a process kit ring, which may include a support ring) according to an aspect of the disclosure. The processing chamber 607 may be identical or similar to the processing chamber 107 of FIG. 1. The processing chamber 607 may include a chamber body 601, a chamber liner 602 layered inside the body 601, a plasma-resistant liner 602, a chuck 150 (e.g., ESC 150), and a dielectric window 606. The processing chamber 607 may further include a source lid 603 (or gas delivery plate) coupled to a top of the chamber body 601. The chamber body 601 and the source lid 603 (or gas delivery plate) together enclose an interior volume of the processing chamber 607. In one embodiment, the source lid 603 includes at least the dielectric window 606 and a dielectric ring 615. A source lid assembly may include the source lid 603 in addition to gas delivery lines 618A and 618B and other supporting structures for delivering processing gas to the processing chamber 607.

The processing chamber 607 may further include a substrate support assembly 610 disposed within the interior volume, the substrate support assembly including the chuck 150 configured to support a substrate in a fixed position during processing of the substrate. An edge ring 90 (or process kit ring) is disposed around a circumference of the chuck 150, optionally coplanar with the chuck 150.

At least one of the chamber body 601 or the lid 603 define an opening at a location that is at least one of above or to a side of the edge ring 90 (or process kit ring). As illustrated in FIG. 6, a gas nozzle 613 may be disposed within the opening in the lid 603 through which to inject gas into the interior of the processing chamber 607. The gas nozzle 613 may be located at approximately a center of the lid 603. In one embodiment, the gas nozzle includes an additional opening, which has a smaller diameter than the opening.

In embodiments, a non-contact sensor 630 (which may be the same or similar to the non-contact sensor 230, such as a high resolution camera) is positioned within the additional opening of the lid 603 within a line of sight of the edge ring 90. At least a portion of the edge ring 90 is within a field of view of the non-contact sensor 630. The non-contact sensor 630 may be located inside of the gas nozzle 613, yet flush with an inside surface of the lid 603 so that there is a clear line of sight of the edge ring 90. Use of a fish-eye lens (with wide-angle view) within the non-contact sensor 630 may help with providing a good line of sight to the edge ring 90. The non-contact sensor 630 may be coupled to the controller 109, e.g., a computing system.

A plasma-resistant lens or window 632 (e.g., a hard gemstone lens) may be disposed at the opening and separating the non-contact sensor 630 from the interior volume. The plasma-resistant lens or window 632 may protect the non-contact sensor from corrosive gases in the interior volume. In varied embodiments, the plasma-resistant lens or window 632 is one of a diamond lens, a corundum lens (e.g., a sapphire lens), or a topaz lens. The non-contact sensor 630 may be vacuum sealed by the plasma-resistant lens or window 632, to keep corrosive gases from contacting the non-contact sensor 630.

In embodiments, the non-contact sensor 630 may be used instead of the non-contact sensors 230 on the diagnostic disc 110, e.g., by acquiring sensor data of a top surface (which includes edges of) the edge ring 90, as illustrated in FIG. 7. The sensor data may then be transmitted either wirelessly or via a wired connection to the controller 109 for image processing as was discussed previously, to determine whether the erosion of the edge ring is within a threshold degree of erosion to be classified as "end of life."

FIG. 7 is a flow chart of a method 700 for using an in-situ non-contact sensor (e.g., non-contact sensor 530 or 630) of a processing chamber for diagnosing end-of-life (EoL) wear of an edge (or process kit) ring and initiating replacement of the process kit ring according various aspects of the disclosure. Some operations of method 700 may be performed by processing logic that may include hardware (circuitry, dedicated logic, etc.), software (such as is run on a general purpose computer system or a dedicated machine), firmware, or some combination thereof. Some operations of method 700 may be performed by a computing device, such as the controller 109 of FIG. 1, that is in control of a robot arm and/or a non-contact sensor. For example, processing logic that performs one or more operations of method 700 may execute on the controller 109.

For simplicity of explanation, the methods are depicted and described as a series of acts. However, acts in accordance with this disclosure can occur in various orders and/or concurrently, and with other acts not presented and described herein. Furthermore, not all illustrated acts may be performed to implement the methods in accordance with the disclosed subject matter. In addition, those skilled in the art will understand and appreciate that the methods could alternatively be represented as a series of interrelated states via a state diagram or events.

With reference to FIG. 7, the method 700 may being with the processing logic determining that the process kit ring in a processing chamber 107 is due for a diagnostic scan based on a number of RF hours (e.g., 300-400 or more) of operation of the processing chamber within a substrate processing system (710) and/or based on other criteria (e.g., an amount of time that has passed since a last analysis was performed of the process kit ring in a processing chamber). At least a portion of the process kit ring is within a field of view of the at least one non-contact sensor 530 or 630.

The method 700 may continue with processing logic acquiring sensor data of a top surface of the process kit ring using at least one non-contact sensor 503 or 630, which may be an in-situ non-contact sensor located within the processing chamber as discussed with reference to FIGS. 5A-5B and FIG. 6, respectively (720). The sensor data may be acquired during interim periods between wafer processing when the process kit ring is within a field of view of the in-situ non-contact sensor, and when optionally the processing chamber is at least partially vented of gas. On advantage of the method 700, however, is that the condition of the top surface of the process kit ring may be continuously monitored during and between wafer processing without the need to fully vent or disassemble the processing chamber.

With additional reference to FIG. 7, in various embodiments, the method 700 further includes the processing logic analyzing the sensor data to determine a degree of erosion of the top surface of the process kit ring, which was discussed in more detail previously (730). The method 700 may further include the processing logic determining whether the degree or erosion meets an EoL threshold of erosion or wear (735). If the EoL threshold has not been reached, the method 700 may continue with the processing logic continuing with substrate processing for an additional number of RF hours before again acquiring new sensor data of the top surface of the process kit ring (745).

If, however, the EoL threshold has been met, the method 700 may continue with the processing logic initiating automated worn process kit ring removal, e.g., by removing the worn process kit ring from the processing chamber back to the storage area (e.g., the FOUP or SSP) (750). The method 700 may optionally continue with the processing logic purging, using a pressurized gas source (e.g., nitrogen) of the processing chamber, residue and particles surrounding an electrostatic chuck adjacent to the (now removed) worn process kit ring (755). The method 700 may continue with the processing logic initiating automated process kit ring replacement, e.g., by moving a new process kit ring from the storage area into the processing chamber as replacement for the worn process kit ring (760). The functionality of the method 700 may be repeated for additional process kit rings in additional processing chambers (765).

Figure 8:
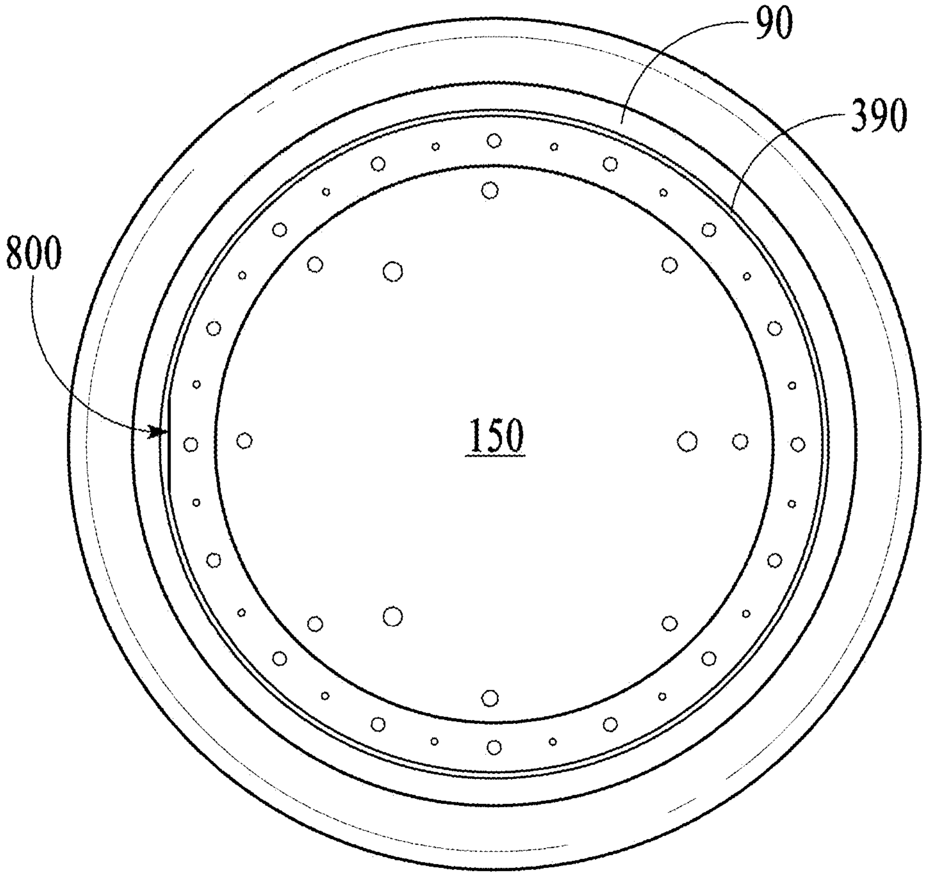
FIG. 8 illustrates a top, plan view, from one of the non-contact sensors disclosed herein, of the edge ring and support ring surrounding an electrostatic chuck (ESC) according to one aspect of the disclosure.

FIG. 8 illustrates a top, plan view, from one of the non-contact sensors disclosed herein, of the edge ring 90 and support ring 390 surrounding an electrostatic chuck (ESC) 150 according to one aspect of the disclosure. The ESC 150 may include a flat region 800 (or other notch or registration feature) along a circumference of an edge of the ESC 150 used to align wafers that are placed thereon. In a similar way, the support ring 390 may include a corresponding flat region (or notch or registration feature) so that when the support ring 390 and edge ring 90 are replaced as a ring kit, the entire process ring kit may be oriented along the flat region 800 and thus properly secured into place centered around the ESC 150 of the processing chamber 107.

In embodiments of the disclosure, the controller 109 may receive sensor data from any of the non-contact sensor described herein in which the controller 109 may determine, from the sensor data, whether the flat regions are mutually aligned during ring kit replacement. If the flat regions are not properly aligned, the controller 109 may signal to the transfer chamber robot 112 to withdraw the ring kit from the processing chamber 107, which may then be realigned at the end effector of the robot arm before being reinserted into the processing chamber 107.

For example, the controller 109 may determine a rotational error (e.g., 0 error), which may be a rotational angle between the target orientation and a current orientation of the ring kit. The controller 109 may send instructions to the transfer chamber robot 112 to cause the transfer chamber robot 112 to rotate the end effector (and ring kit supported on the end effector) a prescribed amount to correct for and eliminate the rotational error. The transfer chamber robot 112 may then place the edge ring 90 into the processing chamber 107 through a corresponding port 108 with the correct orientation. Accordingly, the rotational error of the edge ring 90 may be eliminated using the degrees of freedom of the transfer chamber robot 112 without use of an aligner station. In an alternative embodiment, functioning of the wafer lift pins 253 may be employed to correct the rotational error, as will be discussed in more detail.

In some embodiments, the transfer chamber robot 112 can correct up to a threshold amount of rotational error of the edge ring 90. For example, one transfer chamber robot 112 may be able to correct up to a 5 degree rotational error, while other factory transfer chamber robots 112 may be able to correct up to a 3 degree rotational error, a 7 degree rotational error, or some other amount of rotational error. If the detected rotational error is greater than the threshold amount of rotational error that can be corrected by the transfer chamber robot 112, then the transfer chamber robot 112 may place the ring kit at an interim station (not shown), reposition the end effector, and then pick back up the ring kit in a manner that either eliminates the rotational error or reduces the rotational error so that it is less than or equal to the threshold amount of rotational error that can be corrected based on rotation of the end effector.

Figure 9A:
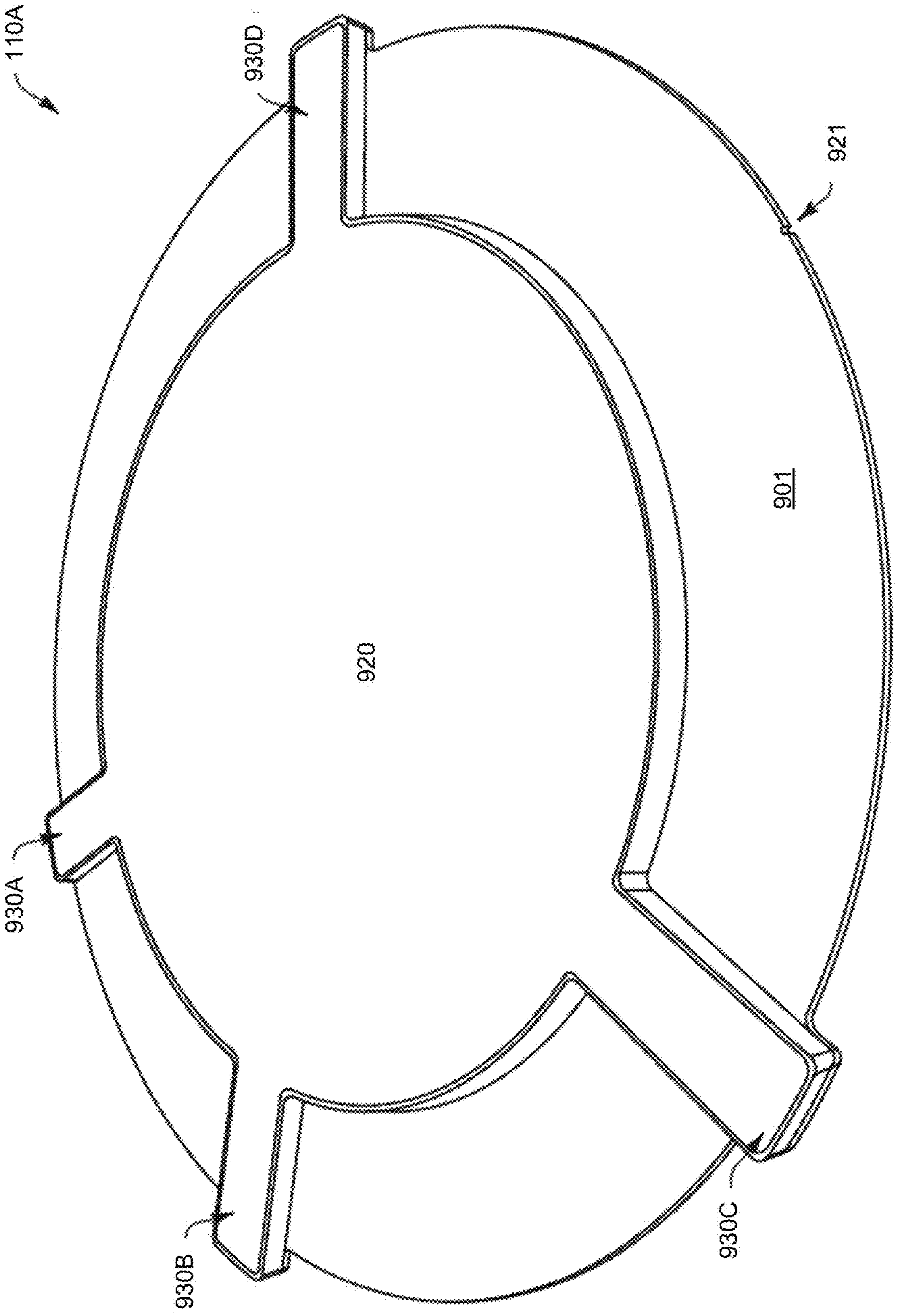
FIG. 9A illustrates a perspective top view of a shielded diagnostic disc according to alternative embodiments of the disclosure.

FIG. 9A illustrates a perspective top view of a diagnostic disc 110A according to alternative embodiments of the disclosure. In these alternative embodiments, a diagnostic disc 110A includes non-contact sensors that are arranged differently on a disc body 901 from those illustrated in FIG. 2, and thus each may not each be positioned opposite from another non-contact sensor. For example, the diagnostic disc 110 may include a number of non-contact sensors such as a first non-contact sensor 930A, a second non-contact sensor 930B, a third non-contact sensor 930C, and a fourth non-contact sensor 930D attached to the four protrusions 904A, 904B, 904C, and 904D, respectively, at differing angles, which will be discussed in more detail with reference to FIG. 9B. In certain embodiments, each non-contact sensor may be attached to an underside of its respective protrusion.

Each non-contact sensor can be oriented in a direction that allows the non-contact sensor to generate sensor data of a component. For instance, each non-contact sensor may be oriented over an edge ring, a process ring, an electrostatic chuck, and the like to generate sensor data for the alignment or concentricity of the edge ring or a process ring (e.g., based on a gap measurement between them or the gap between the electrostatic chuck and the process ring) or sensor data for the degree of erosion or cleanliness of the edge ring or process kit ring.

Figure 9B:
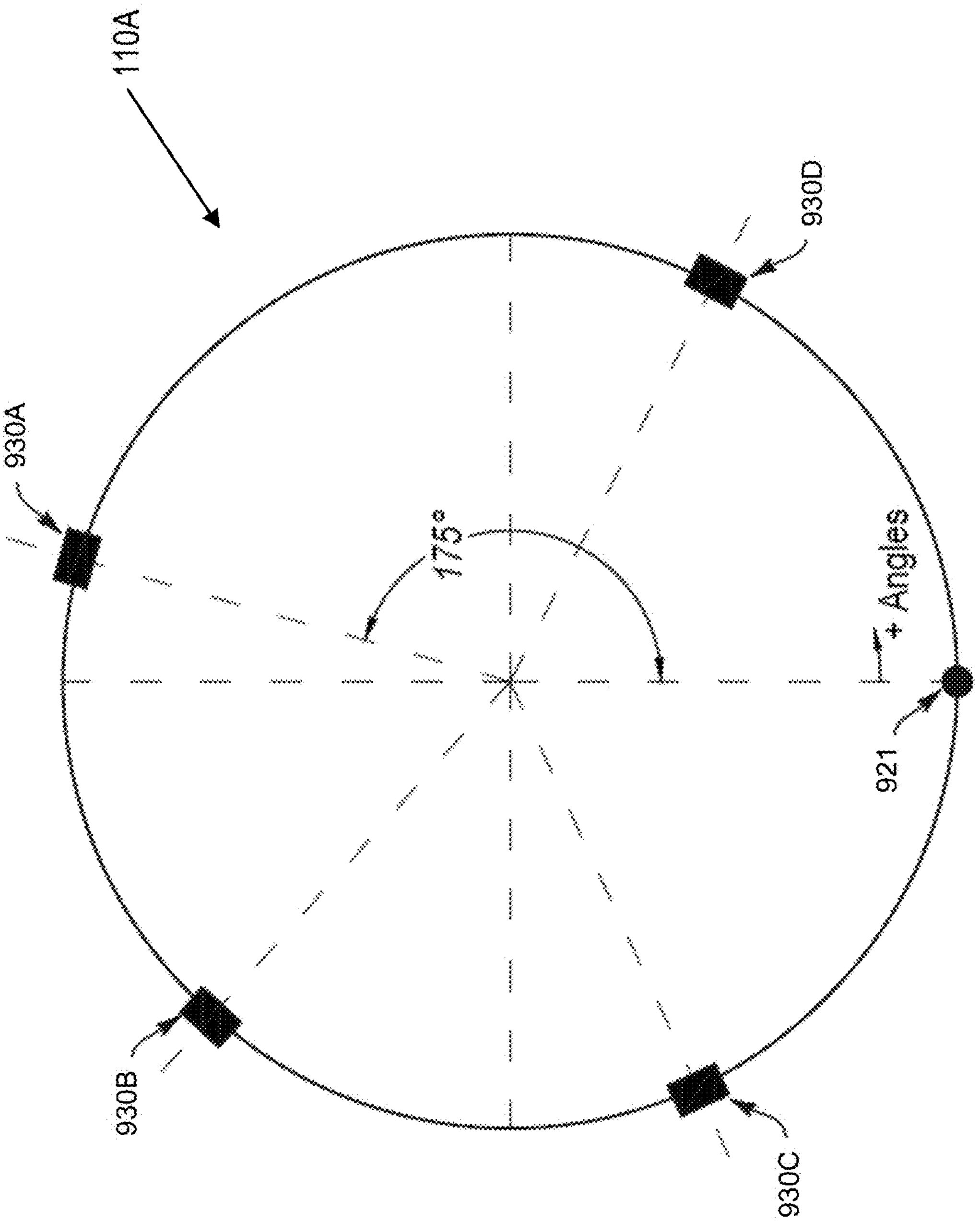
FIG. 9B illustrates a schematic depicting positions of four non-contact sensors on the diagnostic disc according to aspects of the disclosure.

FIG. 9B illustrates a schematic depicting positions of the four non-contact sensors on the diagnostic disc 110B according to aspects of the disclosure. In the depicted embodiment, the disc body 901 includes a notch at a first position 921 on the circumference of the disc-shaped body. First position 921 may be referred to as the starting angle of 0°. The notch may be used with a pre-aligner so that the diagnostic disc 110 may be placed in a selected location in processing chamber 107 and/or may be picked up by an end effector.

In the depicted embodiment, the first non-contact sensor 930A may be attached to the first protrusion 904A that is positioned at an angle of about 170°-180° from the first position of the notch. In the depicted embodiment, the second non-contact sensor 930B may be attached to the second protrusion 904B that is positioned at an angle of about 225°-235° from the first position of the notch, where the 175° angle depicted is merely illustrative of an angle with this range of angles. In the depicted embodiment, the third non-contact sensor 930C may be attached to the third protrusion 904C that is positioned at an angle of about 295°-305° from the first position of the notch. In the depicted embodiment, the fourth non-contact sensor 930D may be attached to the fourth protrusion 904D that is positioned at an angle of about 55°-65° from the first position of the notch.

The first non-contact sensor 930A may be attached to the first protrusion 904A at about 295 mm to about 305 mm from an outer perimeter of the disc body 901. The second non-contact sensor 930B, the third non-contact sensor 930C, and the fourth non-contact sensor 930D attached to the second protrusion 904B, the third protrusion 904C, and the fourth protrusion 904D, respectively, may be positioned at about 310 mm to about 320 mm from the outer perimeter of the disc-shaped body 901.

The positions of the second protrusion 904B, the third protrusion 904C, and the fourth protrusion 904D and the corresponding second non-contact sensor 930B, third non-contact sensor 930C, and fourth non-contact sensor 930D, as described with respect to FIGS. 9A-9B, should not be construed as limiting as their positions could vary depending on the processing chamber used, the main frame robot used, the transfer chamber robot used, the end effectors of the robots, and so on. The at least one protrusion and the non-contact sensors attached thereto may be arranged in other angles or at other location so long as the non-contact sensors have clearance (e.g., past the end effector) to see the component or the area within the processing chamber that is being diagnosed.

In the depicted embodiment, the first non-contact sensor 930A (e.g., first camera) is positioned so that it is centered on an edge of a flat region (800 in FIG. 8) and a beginning of the circular edge of ESC 150. The second non-contact sensor 930B (e.g., second camera), third non-contact sensor 930C (e.g., third camera), and fourth non-contact sensor 930D (e.g., fourth camera) in the depicted embodiment are positioned to view the ring section of the process kit ring, e.g., edge ring 90 and support ring 390. The positioning of non-contact sensors 930A, 930B, 930C, and 930D in the depicted embodiment allow measurement of the gap between the ESC 150 and the process kit ring to determine alignment and concentricity of the process kit ring according to an embodiment described in further detail below with respect to FIG. 11 and FIGS. 12A-12B.

Figure 10:
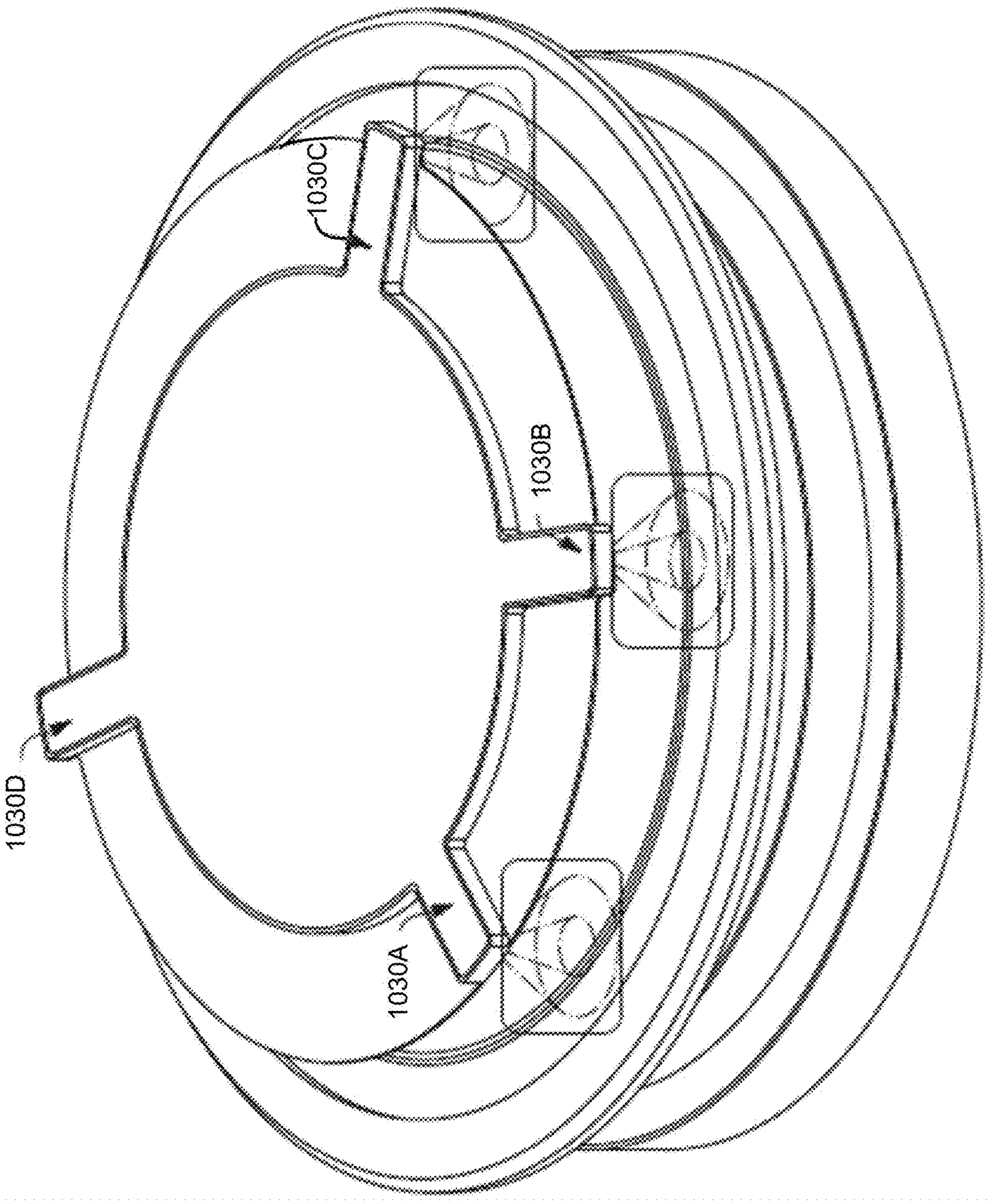
FIG. 10 illustrates a viewing position of a diagnostic disc (e.g., 110) configured to view positioning of a process kit ring (such as alignment and concentricity) according to an aspect of the disclosure.

FIG. 10 illustrates a viewing position of a diagnostic disc (e.g., 110A) configured to view positioning of a process kit ring (such as alignment and concentricity) according to an aspect of the disclosure. The diagnostic disc is illustrated at a vertical distance above the ESC (e.g., 150). The diagnostic disc may reach the depicted viewing position when sitting in a transfer robot's arm, e.g., such as end effector of a transfer robot 112, or when sitting on the wafer lift pins 253.

In the depicted embodiment, the diagnostic disc (e.g., 110A) has four high resolution cameras (i.e., non-contact sensors) that capture sensor data of the edge and curvature of the process kit ring according to an exemplary embodiment of the disclosure. In the depicted viewing position, the first camera 1030A is positioned above flat region 800 of ESC 150 with its line of sight on the flat region 800 where it can capture the beginning of the curvature of the kit ring. In the depicted viewing position, the second camera 1030B, the third camera 1030C, and the fourth camera 1030D, are all positioned above the edge of the kit ring diameter. Such sensor data could assist the controller 109 in determining alignment and concentricity of a ring kit, for instance, as described with respect to FIG. 8 above and herein below.

Figure 11:
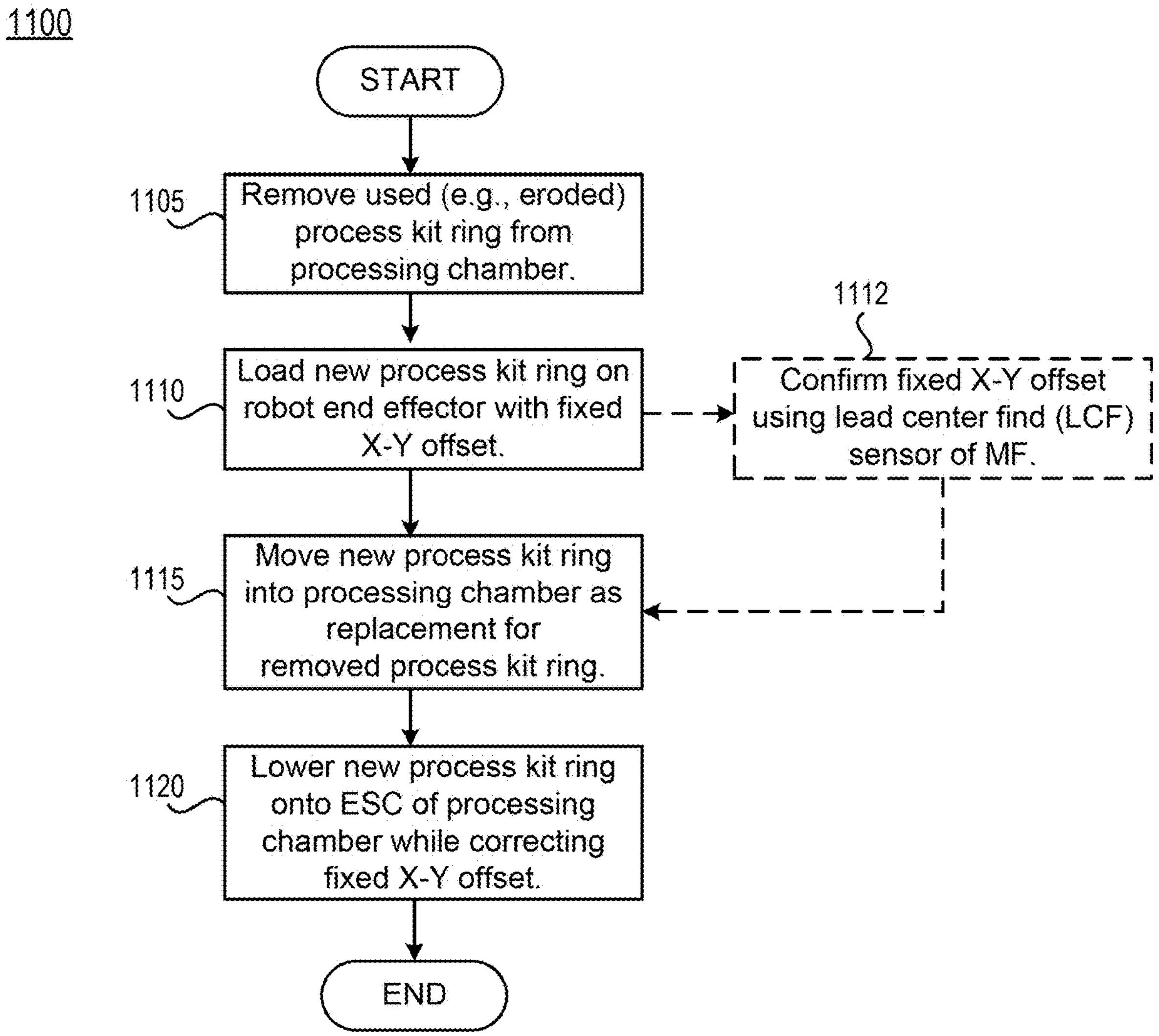
FIG. 11 is a flow chart of a method for replacing an old process kit ring with a new process kit ring within a processing chamber according to an aspect of the disclosure.

FIG. 11 is a flow chart of a method 1100 for replacing an old process kit ring with a new process kit ring within a processing chamber according to an aspect of the disclosure. The 1100 may cover at least one embodiment for automated replacement of the process kit ring. Some operations of method 1100 may be performed by processing logic that may include hardware (circuitry, dedicated logic, etc.), software (such as is run on a general purpose computer system or a dedicated machine), firmware, or some combination thereof. Some operations of method 1100 may be performed by a computing device, such as the controller 109 of FIG. 1, that is in control of a robot arm and/or a non-contact sensor. For example, processing logic that performs one or more operations of method 1100 may execute on the controller 109.

At operation 1105, the processing logic directs the removal of the used (e.g. eroded) process kit ring from the processing chamber 107. To do so, the processing logic may direct the transfer chamber robot 112 to reach into the processing chamber to remove, using its end effector, the used process kit ring (e.g., a wafer edge ring or more simply "edge ring" 90 and support ring 390). In some embodiments, only the edge ring is removed if there is no damage to the support ring. Thus, removal and replacement of the support ring is optional, and reference to process kit ring may include reference to just the edge ring 90 or to both the edge ring 90 and the support ring 390. The used process kit ring may be passed through one the stations 104*a* or 104*b* and collected by the factory interface robot 111, and delivered to one of a FOUP or SSP for extraction from the processing system 100.

At operation 1110, the processing logic reverses process of operation 1105 to load a new process kit ring, e.g., from a FOUP or SSP and through the station 104*a* or 104*b*, and onto an end effector of the transfer chamber robot 112 with a fixed X-Y offset, such as between 50 μm and 250 μm, for example. A fixed X-Y offset refers to a two-dimensional offset of the new process kit ring from a nominally central position on the end effector, e.g., with respect to a mechanical tolerance allowance of the process kit ring and the side of the ESC assembly.

At operation 1112, the processing logic may optionally confirm the amount of the fixed X-Y offset, for example, by using lead center find (LCF) sensors on the mainframe of the processing system 100. For example, one or more LCF sensor may be positioned within the ports 108 leading into the processing chambers. The processing logic can verify or confirm the amount of fixed X-Y offset of the new processing kit ring by connecting to and using the LCF sensor leading into the processing chamber 107.

At operation 1115, the processing logic directs the transfer chamber robot 112 to move (or insert) the new process kit ring into the processing chamber 107 as a replacement for the removed process kit ring. In this way, the movement of the new process kit ring may the same as moving a wafer from a FOUP or SSP in the factory interface 91, through one of the station(s) 104*a* or 104*b*, through the transfer chamber 106, and into the processing chamber 107, except for providing for the fixed X-Y offset, for example.

At operation 1120, the processing logic directs the transfer chamber robot 112 to lower the new process kit ring onto the ESC 150 of the processing chamber 107 while correcting the fixed X-Y offset of the new process kit ring. The correcting of the fixed X-Y offset may be performed using stepper motors coupled to the three wafer lift pins 253 illustrated in FIG. 3. More specifically, the new process kit ring is placed on top of the three wafer lift pins 253. The processing logic can direct the stepper motors coupled to the three wafer lift pins to be lowered and raised following a preconfigured order of rising and lowering specified wafer lift pins that will remove the fixed X-Y offset as the new process kit ring is ultimately lowered into a nominally central location on top of the ESC 150.

Figure 12A:
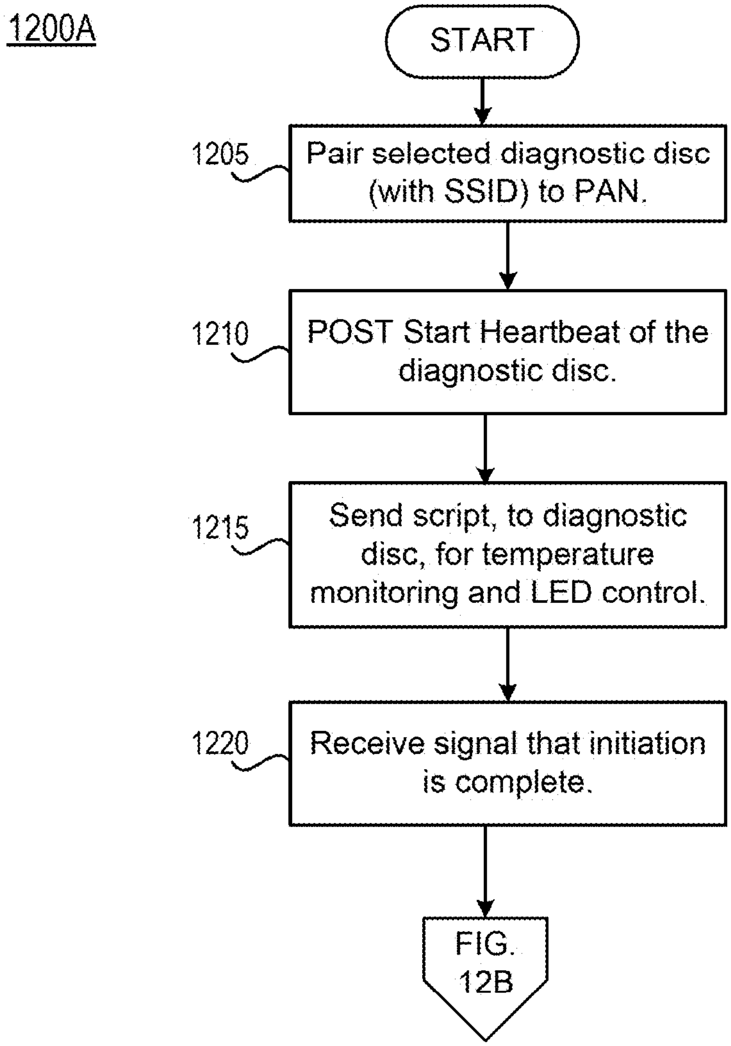
FIG. 12A is a flow chart of a method for pairing and initializing a diagnostic disc for use in verifying placement of the new process kit according to aspects of the disclosure.
Figure 12B:
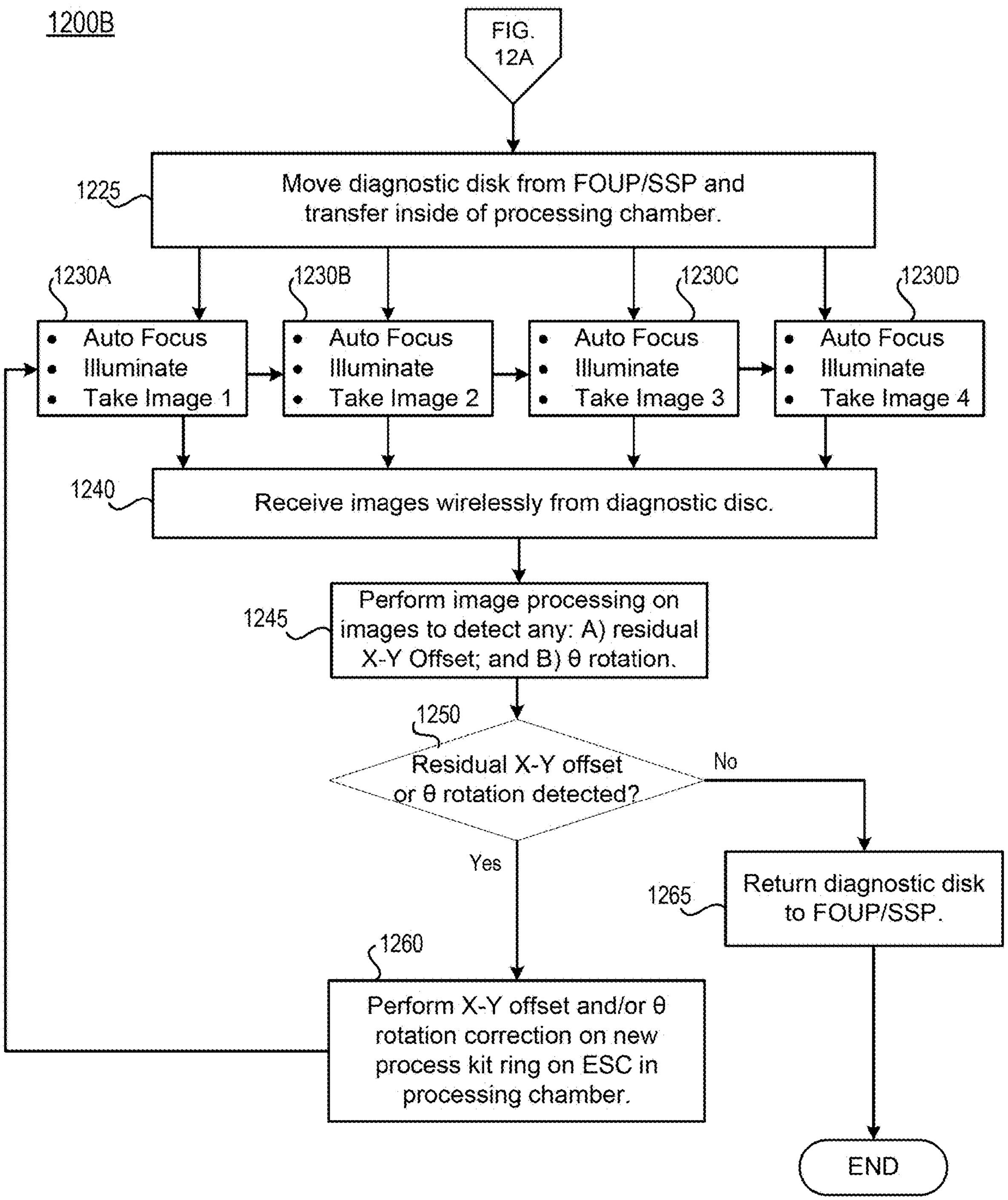
FIG. 12B is a flow chart of a method for verifying, using the diagnostic disc, correct placement of the new process kit within the processing chamber according to various aspects of the disclosure.
Figure 13A:
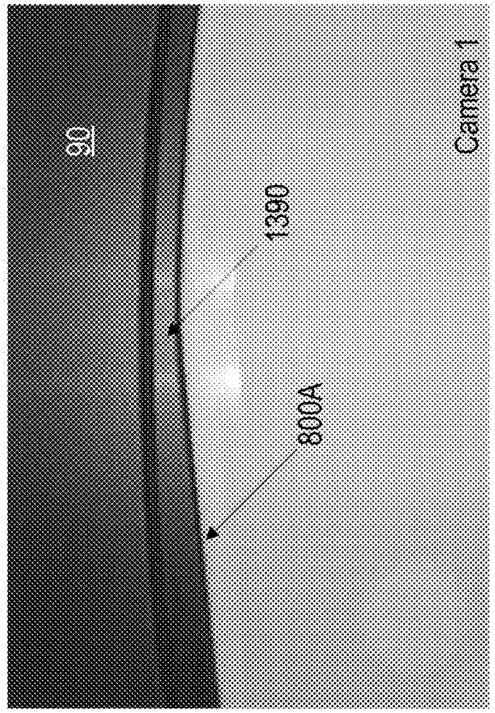
FIGS. 13A, 13B, 13C, and 13D are example high definition images captured by a first non-contact sensor, a second non-contact sensor, a third non-contact sensor, and a fourth non-contact sensor, respectively, of the diagnostic disc.
Figure 13B:
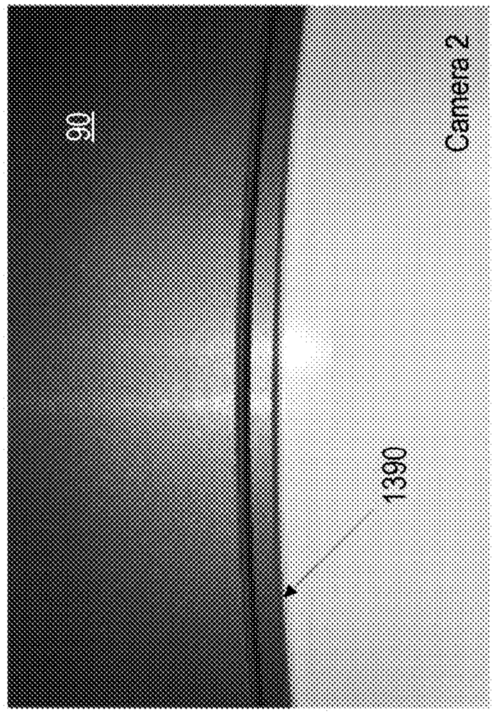
Figure 13C:
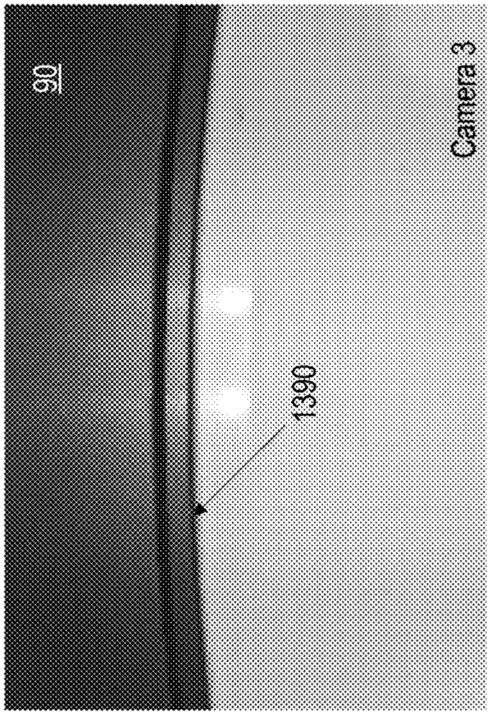
Figure 13D:
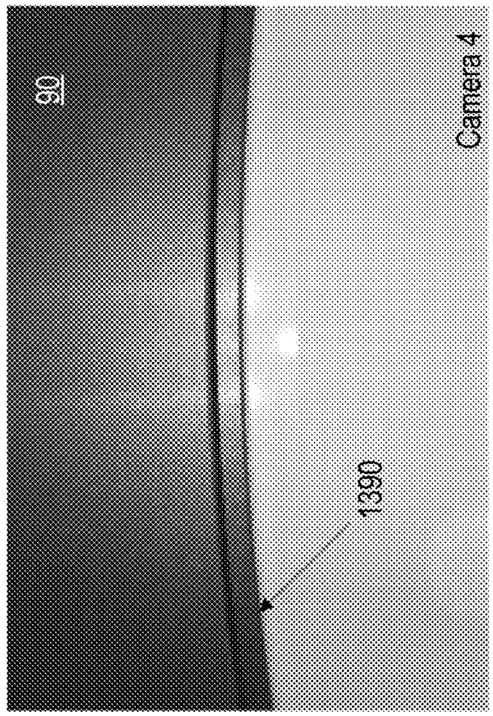

Because it is possible that there is residual X-Y offset and/or rotational error after the new process kit ring is lowered into place, the diagnostic disc 110 or 11A will be employed to confirm the new process kit ring is sitting in a normal central location on top of the ESC 150, and thus properly positioned and ready to support wafer processing (FIG. 12B). The diagnostic disc can inform the processing logic of any, and the extent of, such residual X-Y offset and/or rotational offset that may exist. The processing logic can fix these residual errors by similarly directing the stepper motors to control the wafer lift pins 253 in order to shift and/or rotate the process kit ring by a measured amount until the process kit ring resides in the normal central location.

FIG. 12A is a flow chart of a method 1200A for pairing and initializing a diagnostic disc for use in verifying placement of the new process kit according to aspects of the disclosure. Some operations of method 1200A may be performed by processing logic that may include hardware (circuitry, dedicated logic, etc.), software (such as is run on a general purpose computer system or a dedicated machine), firmware, or some combination thereof. Some operations of method 1200A may be performed by a computing device, such as the controller 109 of FIG. 1, that is in control of a robot arm and/or a non-contact sensor. For example, processing logic that performs one or more operations of method 1200A may execute on the controller 109.

At operation 1205, the processing logic pairs a selected diagnostic disc, e.g., that has a specific service set identifier (SSID) to a wireless personal area network (PAN) or other close wireless network set up for communicating with the diagnostic disc. Such pairing may be performed using Bluetooth™, ZigBee™, infrared, or ultrawideband (UWB), and the like.

At operation 1210, the processing logic performs a POST start heartbeat procedure that ensures continued wireless connectivity with the diagnostic disc that will be used to transmit images and/or video from the diagnostic disc to the controller 109.

At operation 1215, the processing logic sends a script, to the diagnostic disc, for temperature monitoring and light emitting diode (LED) control. Such control may ensure safe operation of the diagnostic disc and proper functioning of the non-contact sensors with the appropriate light for imagining, for example.

At operation 1220, the processing logic receives a signal that initiation is complete, and thus, that the diagnostic disc can be moved through the processing system 100 and into the chamber 107 to perform diagnostics on the new process kit ring (FIG. 12B).

FIG. 12B is a flow chart of a method 1200B for verifying, using the diagnostic disc, correct placement of the new process kit within the processing chamber according to various aspects of the disclosure. Some operations of method 1200B may be performed by processing logic that may include hardware (circuitry, dedicated logic, etc.), software (such as is run on a general purpose computer system or a dedicated machine), firmware, or some combination thereof. Some operations of method 1200B may be performed by a computing device, such as the controller 109 of FIG. 1, that is in control of a robot arm and/or a non-contact sensor. For example, processing logic that performs one or more operations of method 1200B may execute on the controller 109.

At operation 1225, the processing logic directs the movement of the diagnostic disc 110A from the factory interface (e.g., from a FOUP or SSP), through the transfer chamber 106 and into the processing chamber 1225, similarly as was discussed with reference to the new process kit ring in FIG. 11 and at operation 415 of FIG. 4. At a set of operations 1230A, 1230B, 1230C, and 1230D, the processing logic may serially or concurrently perform imaging of any gap between the edge ring 90 (of the new process kit ring) and the ESC 150. Each non-contact sensor (e.g., high definition camera) of the diagnostic disc may image a different portion of the edge of the edge ring 90 and the support ring 390, e.g., by performing an auto focus, illumination (e.g., using one or more LED light), and capturing the image.

At operation 1240, the processing logic receives these four images wirelessly from the diagnostic disc. These may be still images taken at various locations around a circumference of the process kit ring. FIGS. 13A, 13B, 13C, and 13D are example high definition images captured by a first non-contact sensor, a second non-contact sensor, a third non-contact sensor, and a fourth non-contact sensor, respectively, of the diagnostic disc. These non-contact sensors may, therefore, be high definition cameras that capture high definition images.

In various embodiments, the process kit ring may include the edge ring 90 and a support ring 1390 having a flat region 800A, which may be imaged by the first non-contact sensor. The flat region 800A may be compatible and meant to physically match up with the flat region 800 of the ESC 150 (FIG. 8). If the flat regions of support ring 1390 and the ESC 150 do not match up, there is a rotation error that may need to be corrected if beyond a threshold angle of rotation, as discussed with reference to FIG. 8. If the X-Y offset has not been eliminated sufficiently, there is a residual X-Y offset that may be corrected.

At operation 1245, therefore, the processing logic performs images processing on the still images received from the diagnostic disc to detect any residual X-Y offset or rotational error (also referred to as theta or θ rotation). At operation 1250, the processing logic determines whether the image processing has detected any residual X-Y offset or theta rotation. If, at operation 1250, there is no positional errors detected of the location of the new process kit ring on the ESC 150, the processing logic, at operation 1265, returns the diagnostic disc to a FOUP or SSP, as was discussed with reference to operation 440 (FIG. 4).

If, at operation 1250, the processing logic detects positional errors, at operation 1260, the processing logic may perform X-Y offset and/or theta rotation correction on the new process kit ring on the ESC 150 in the processing chamber 107. For example, the processing logic can calculate an amount of residual X-Y offset and/or theta rotation using the image processing. The processing logic may then direct the stepper motors coupled to the wafer lift pins 253 to lift and lower the process kit ring in calculated order and amounts in order to shift and or rotate the process kit ring in such a way as to remove the residual X-Y offset and/or theta rotation (e.g., rotational error).

If the error is too great, the transfer chamber robot 112 may lift the process kit ring out of the processing chamber, set it down in an interim station or other processing chamber, and pic it back up again in a way that reduces the amount of residual X-Y offset and/or theta rotation. The need for this measure is expected to be rare, however, due to the ability to set a pre-determined fixed X-Y offset that includes a pre-calculated order and amount of lifting and lowering the wafer lift pins 253 that are expected to, under normal operations, center the process kit ring on the ESC 150.

After operation 1260, the processing logic may loop back within the method 1200B to the operations 1230A, 1230B, 1230C, and 1230D to repeat generate and perform diagnostic processing on newly acquired high definition images. Thus, the diagnostic method 1200B of FIG. 12B may be iterative until detecting a lack of appreciable residual X-Y offset or theta rotation at operation 1250. There may be allowed a small amount of tolerance in X-Y offset and theta rotation such that being within a threshold percentage (e.g., 90 or more percent or the like) of the nominal centered location on the ESC 150 is sufficiently close to being centered. If within these tolerances, the processing logic may proceed to operation 1265 and return the diagnostic disc 110A to the factory interface or proceed to use the diagnostic disc 110A in another processing chamber (if replacing more than one process kit ring at the same time).

The preceding description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the scope of the present invention.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner. In one embodiment, multiple metal bonding operations are performed as a single step.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A diagnostic disc comprising:

a disc body comprising a sidewall around a circumference of the disc body and at least one protrusion extending outwardly from a top of the sidewall;

a non-contact sensor attached to an underside of each of the at least one protrusion;

a printed circuit board (PCB) positioned within an interior formed by the disc body;

circuitry disposed on the PCB and coupled to each non-contact sensor, the circuitry comprising at least a wireless communication circuit, a memory, and a battery; and a cover positioned over the circuitry inside of the sidewall, wherein the cover seals the circuitry within the interior formed by the disc body from an environment outside of the disc body.

2. The diagnostic disc of claim 1, wherein the at least one protrusion comprises four protrusions positioned around the disc body and approximately perpendicular to the sidewall.

3. The diagnostic disc of claim 1, wherein a diameter of the disc body is approximately 11.5 inches to 12.25 inches, and wherein each of the at least one protrusion protrudes by about ten percent of the diameter such that an area from between approximately 6.5 inches and 6.75 inches from a center of the disc body is within a field of view of the non-contact sensor.

4. The diagnostic disc of claim 1, wherein each non-contact sensor is positioned on a respective protrusion such that a vertical distance between the non-contact sensor and a bottom of the disc body displaces the non-contact sensor from a surface that the diagnostic disc is placed upon, and wherein a height of the sidewall is between about 0.350 inches and about 0.450 inches.

5. The diagnostic disc of claim 1, wherein the disc body and the cover are comprised of one of carbon fiber or aluminum with a coating made of one or anodized aluminum, ceramic, or yttria.

6. The diagnostic disc of claim 1, wherein the non-contact sensor comprises a depth camera having a zoom of at least four times magnification.

7. The diagnostic disc of claim 1, wherein the disc body comprises multiple kinematic couplings disposed on a bottom surface, the multiple kinematic couplings each to receive a wafer lift pin of an electrostatic chuck within a processing chamber and to provide a low contact area between the diagnostic disc and the electrostatic chuck.

8. A processing chamber comprising:

a chamber body;

a source lid coupled to a top of the chamber body, wherein the chamber body and the source lid together enclose an interior volume;

a substrate support assembly disposed within the interior volume, the substrate support assembly comprising a chuck configured to support a substrate in a fixed position during processing of the substrate;

an edge ring disposed around a circumference of the chuck, wherein at least one of the chamber body or the source lid define an opening at a location that is at least one of above or to a side of the edge ring;

a non-contact sensor positioned within the opening and within a line of sight of the edge ring, wherein at least a portion of the edge ring is within a field of view of the non-contact sensor;

a plasma-resistant lens or window disposed at the opening and separating the non-contact sensor from the interior volume, wherein the plasma-resistant lens or window is to protect the non-contact sensor from corrosive gases in the interior volume; and a computing device operatively coupled to the non-contact sensor, wherein the computing device is to:

receive sensor data of a top surface of the edge ring from the non-contact sensor;

analyze the sensor data to determine a degree of erosion of the top surface of the edge ring; and in response to a determination that the degree of erosion meets an end-of-life threshold, initiate automated replacement of the edge ring.

9. The processing chamber of claim 8, wherein the non-contact sensor is a camera that is vacuum sealed by the plasma-resistant lens.

10. The processing chamber of claim 8, further comprising a plasma resistant liner that lines at least a sidewall of the chamber body, wherein the plasma resistant liner comprises an additional opening that approximately lines up with the opening in the sidewall of the chamber body.

11. The processing chamber of claim 10, wherein the opening and the additional opening define an endpoint window for the processing chamber, and wherein at least a portion of the non-contact sensor is disposed within the additional opening.

12. The processing chamber of claim 8, further comprising a gas nozzle disposed within the opening in the source lid, the gas nozzle comprising an additional opening that has a smaller diameter than the opening, wherein the non-contact sensor is disposed within the additional opening, and wherein a front of the non-contact sensor is approximately flush with an inside surface of the source lid.

13. The processing chamber of claim 8, further comprising circuitry coupled to the non-contact sensor and to a computing system, the circuitry to transmit sensor data from the non-contact sensor to the computing system, wherein the sensor data comprises information about a roughness of a top surface of the edge ring.

14. A diagnostic disc comprising:

a disc body comprising a sidewall around a circumference of the disc body and at least one protrusion extending outwardly from a top of the sidewall;

a non-contact sensor attached to an underside of each of the at least one protrusion, wherein each non-contact sensor is positioned on a respective protrusion such that a vertical distance between the non-contact sensor and a bottom of the disc body displaces the non-contact sensor from a surface that the diagnostic disc is placed upon;

a printed circuit board (PCB) positioned within an interior formed by the disc body; and circuitry disposed on the PCB and coupled to each non-contact sensor, the circuitry comprising at least a wireless communication circuit, a memory, and a battery.

15. The diagnostic disc of claim 14, wherein the at least one protrusion comprises four protrusions positioned around the disc body and approximately perpendicular to the sidewall.

16. The diagnostic disc of claim 14, wherein a height of the sidewall is between about 0.350 inches and about 0.450 inches.

17. The diagnostic disc of claim 14, further comprising a cover positioned over the circuitry inside of the sidewall, wherein the cover seals the circuitry within the interior formed by the disc body from an environment outside of the disc body.

18. The diagnostic disc of claim 17, wherein the disc body and the cover are comprised of one of carbon fiber or aluminum with a coating made of one or anodized aluminum, ceramic, or yttria.

19. The diagnostic disc of claim 14, wherein the non-contact sensor comprises a depth camera having a zoom of at least four times magnification.

20. The diagnostic disc of claim 14, wherein the disc body comprises multiple kinematic couplings disposed on a bottom surface, the multiple kinematic couplings each to receive a wafer lift pin of an electrostatic chuck within a processing chamber and to provide a low contact area between the diagnostic disc and the electrostatic chuck.

* * * * *